(12) United States Patent
Ebe et al.

(10) Patent No.: US 8,907,502 B2
(45) Date of Patent: Dec. 9, 2014

(54) ENCAPSULATING LAYER-COVERED SEMICONDUCTOR ELEMENT, PRODUCING METHOD THEREOF, AND SEMICONDUCTOR DEVICE

(71) Applicant: Nitto Denko Corporation, Ibaraki-shi, Osaka (JP)

(72) Inventors: Yuki Ebe, Osaka (JP); Hiroyuki Katayama, Osaka (JP); Ryuichi Kimura, Osaka (JP); Hidenori Onishi, Osaka (JP); Kazuhiro Fuke, Osaka (JP)

(73) Assignee: Nitto Denko Corporation, Osaka (JP)

( * ) Notice: Subject to any disclaimer, the term of this patent is extended or adjusted under 35 U.S.C. 154(b) by 0 days.

(21) Appl. No.: 13/914,231

(22) Filed: Jun. 10, 2013

(65) Prior Publication Data

US 2014/0001657 A1   Jan. 2, 2014

(30) Foreign Application Priority Data

Jun. 29, 2012   (JP) ................. 2012-147554
Jan. 30, 2013   (JP) ................. 2013-015781

(51) Int. Cl.
*H01L 33/52*   (2010.01)
*H01L 23/28*   (2006.01)
*H01L 21/56*   (2006.01)
*H01L 33/00*   (2010.01)

(52) U.S. Cl.
CPC ............ *H01L 33/52* (2013.01); *H01L 21/56* (2013.01); *H01L 23/28* (2013.01); *H01L 33/0095* (2013.01); *H01L 2933/005* (2013.01); *H01L 2924/0002* (2013.01)
USPC .......................... 257/787; 438/27; 438/127

(58) Field of Classification Search
CPC .......... H01L 33/52; H01L 21/56; H01L 23/28
USPC ..................... 257/787; 438/27, 127
See application file for complete search history.

(56) References Cited

U.S. PATENT DOCUMENTS

| | | | |
|---|---|---|---|
| 2001/0018229 A1* | 8/2001 | Kato et al. ................. | 438/106 |
| 2002/0011655 A1 | 1/2002 | Nishiyama et al. | |
| 2003/0092252 A1 | 5/2003 | Nishiyama et al. | |
| 2006/0237142 A1* | 10/2006 | Park et al. .................. | 156/584 |
| 2008/0227239 A1* | 9/2008 | Shibata et al. .............. | 438/110 |
| 2009/0133904 A1* | 5/2009 | Koga et al. .................. | 174/251 |

FOREIGN PATENT DOCUMENTS

JP   2001-308116 A   11/2001

* cited by examiner

*Primary Examiner* — Peniel M Gumedzoe
(74) *Attorney, Agent, or Firm* — Sughrue Mion, PLLC

(57) ABSTRACT

A method for producing an encapsulating layer-covered semiconductor element includes the steps of preparing a support sheet including a hard support board formed with a through hole passing through in a thickness direction and a pressure-sensitive adhesive layer laminated on a surface at one side in the thickness direction of the support board so as to cover the through hole; disposing a semiconductor element on a surface at one side in the thickness direction of the pressure-sensitive adhesive layer in opposed to the through hole in the thickness direction; covering the semiconductor element with an encapsulating layer to produce an encapsulating layer-covered semiconductor element; and inserting a pressing member into the through hole from the other side in the thickness direction to peel the encapsulating layer-covered semiconductor element from the pressure-sensitive adhesive layer.

7 Claims, 13 Drawing Sheets

FIG. 1
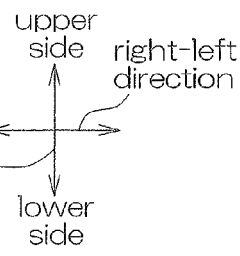
FIG. 1 (a)
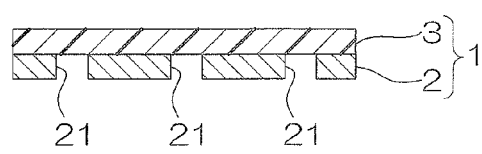
FIG. 1 (b)
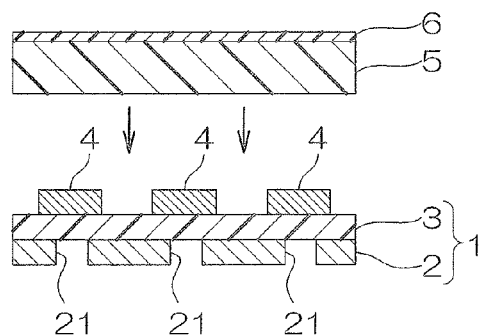
FIG. 1 (c)
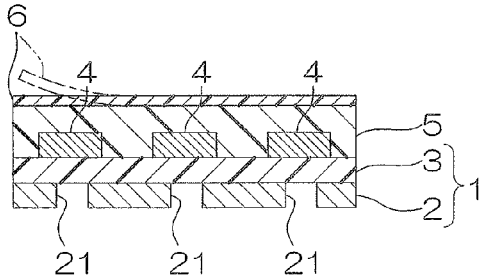
FIG. 1 (d)
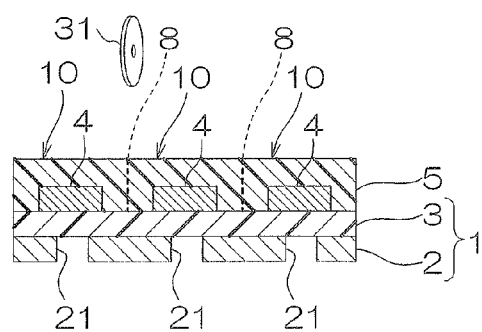
FIG. 1 (e)
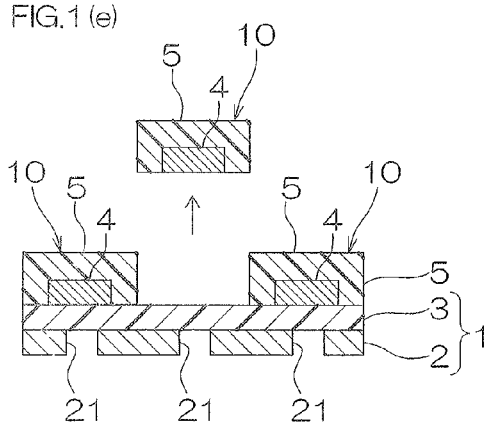
FIG. 1 (e')
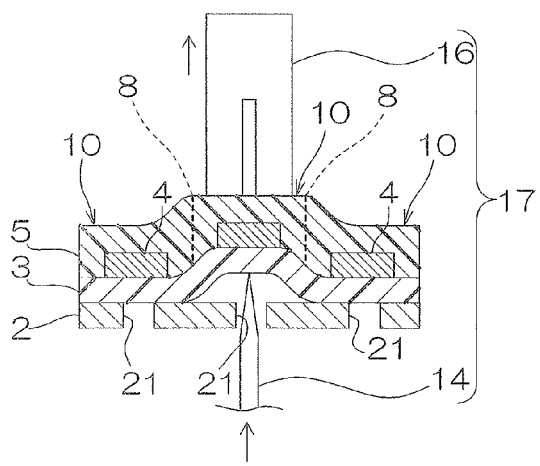
FIG. 1 (f)
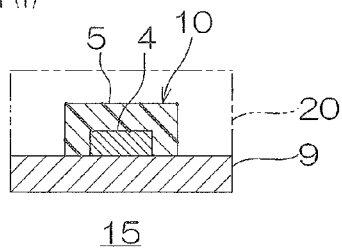

FIG. 4
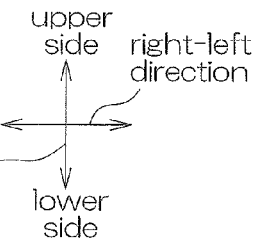
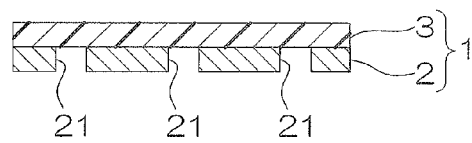
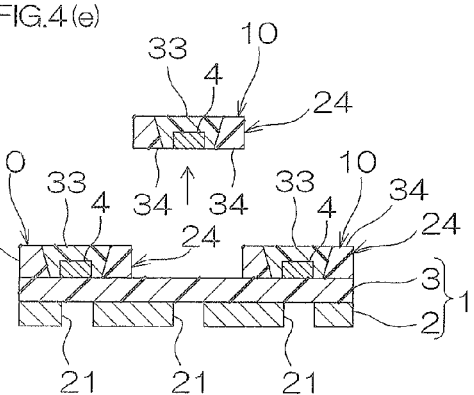
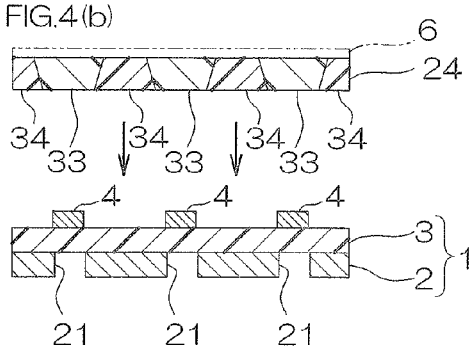
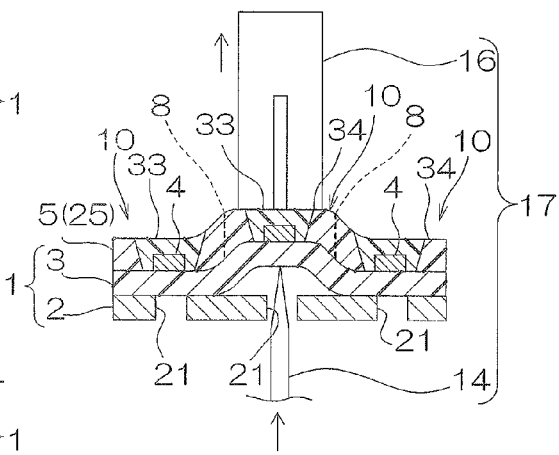
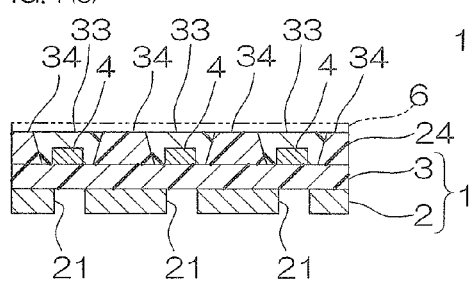
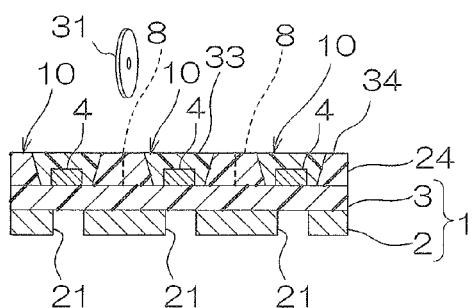
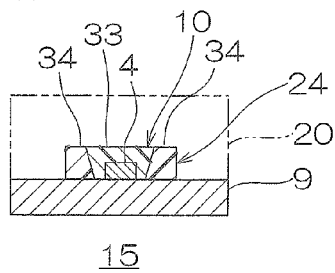

FIG.7
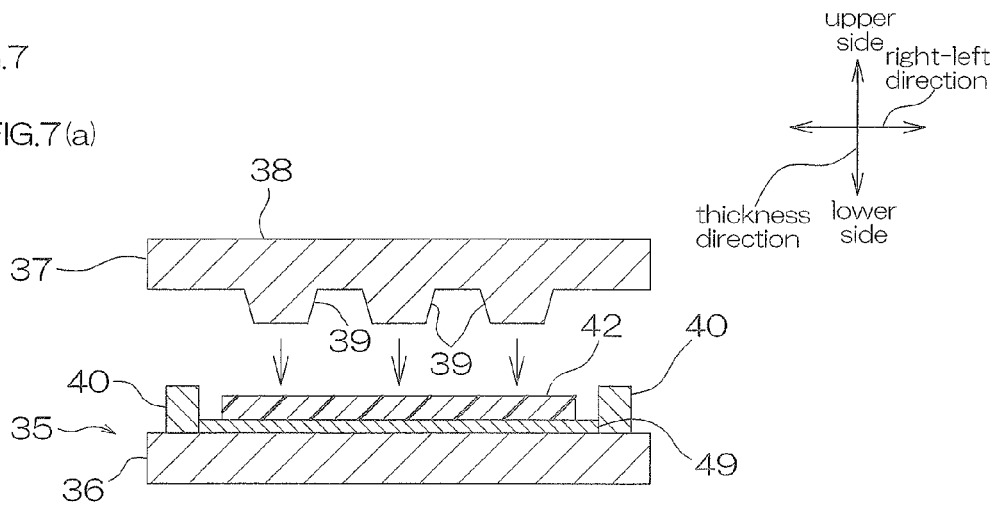
FIG.7(a)
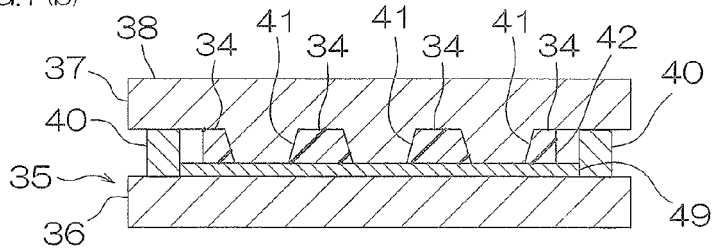
FIG.7(b)
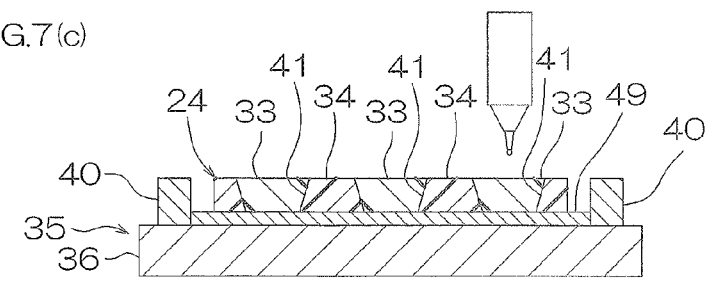
FIG.7(c)
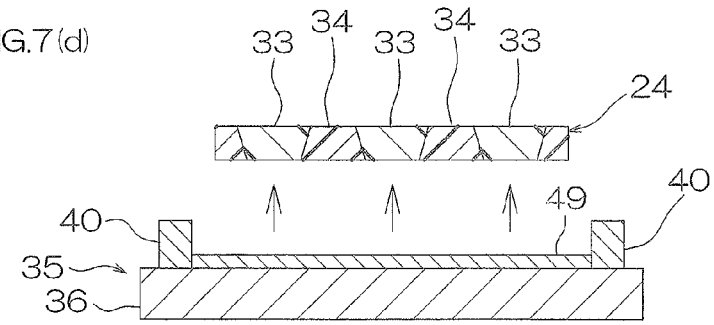
FIG.7(d)

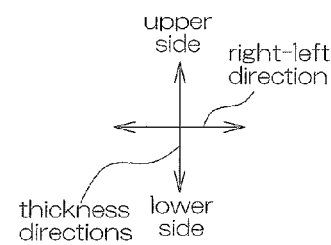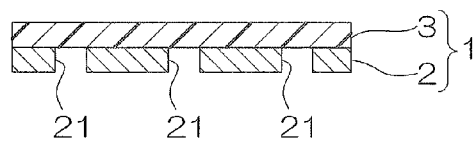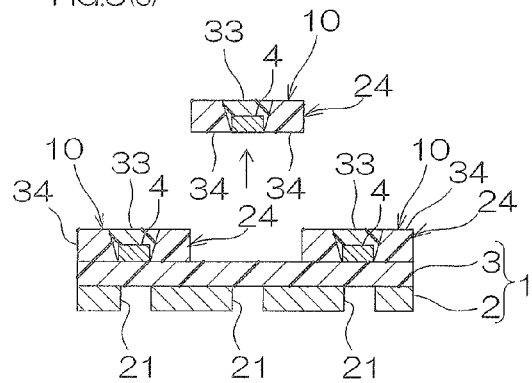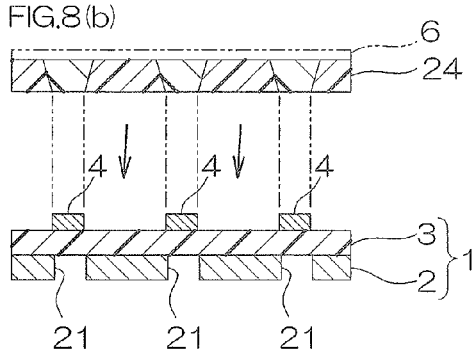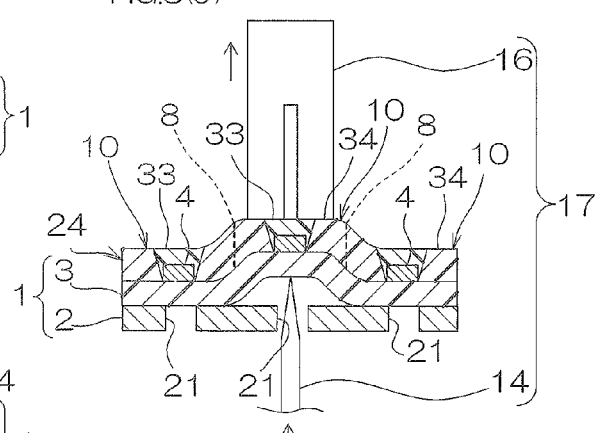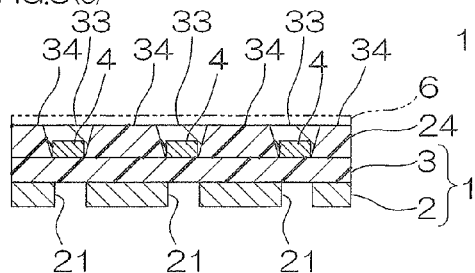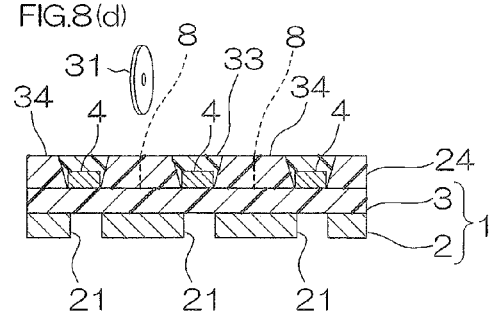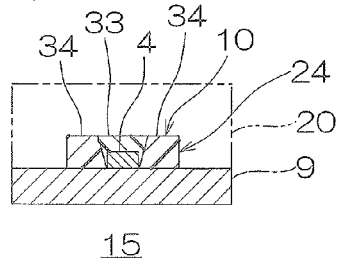

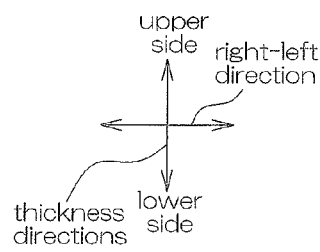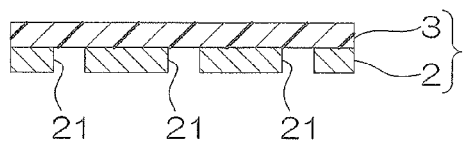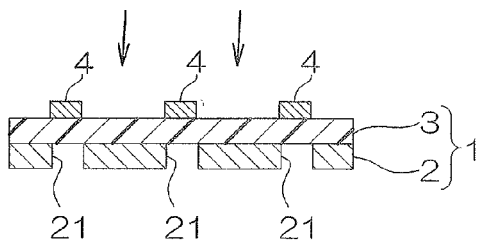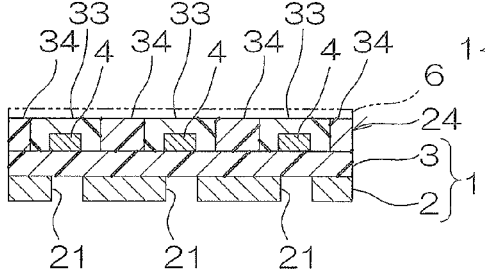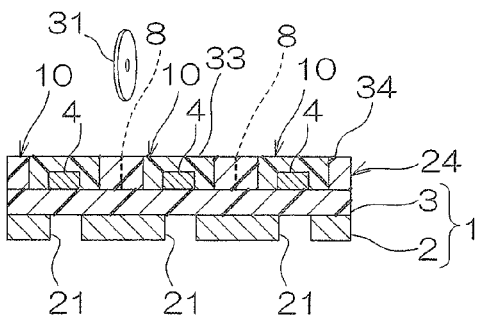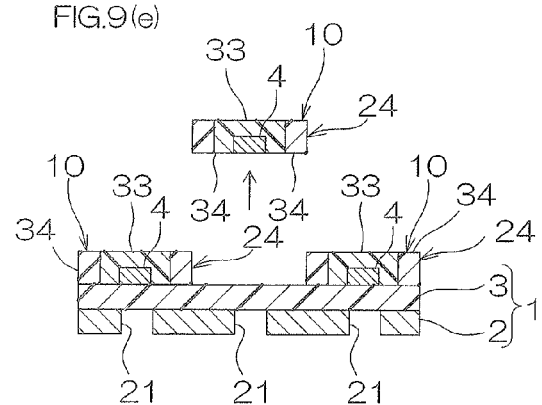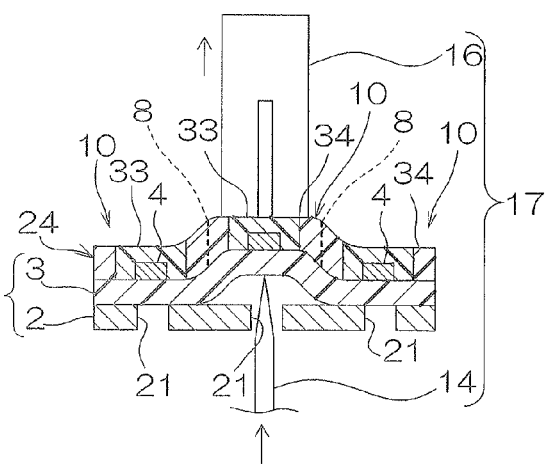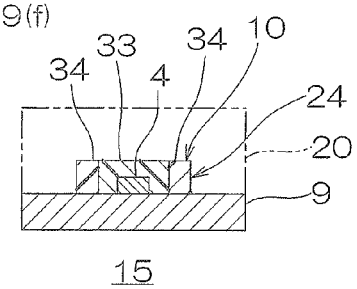

FIG.10
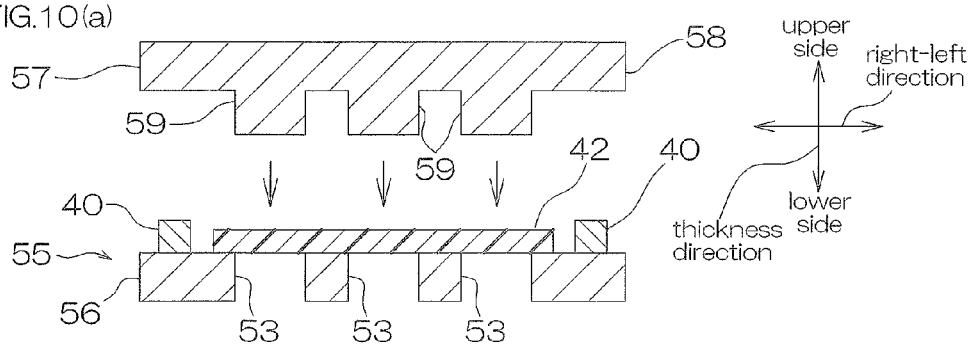
FIG.10(a)
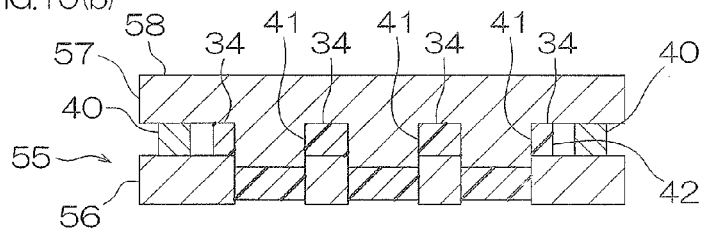
FIG.10(b)
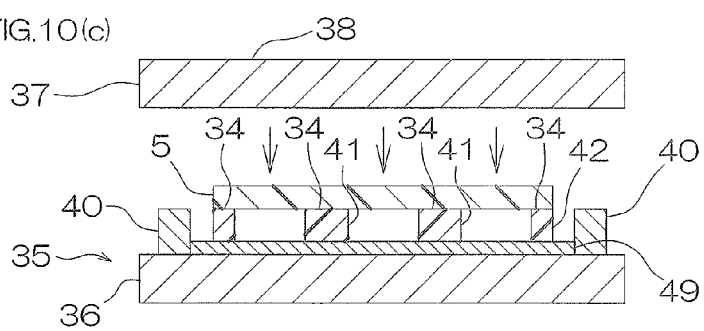
FIG.10(c)
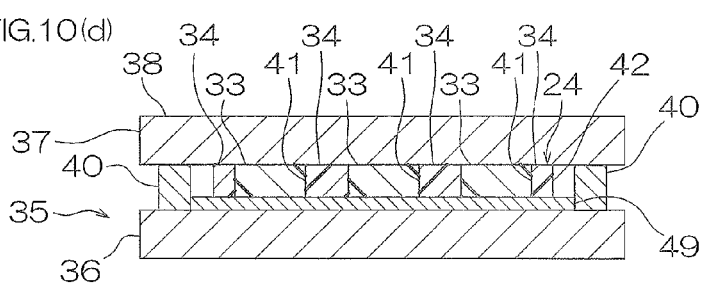
FIG.10(d)
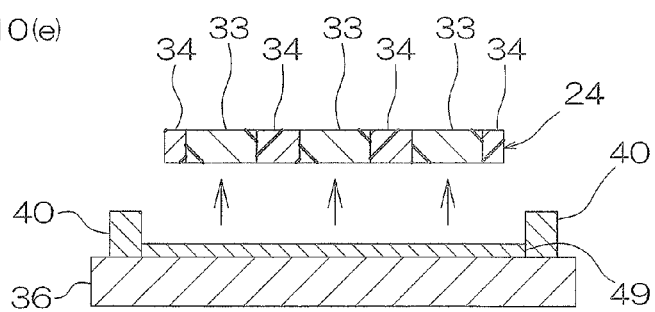
FIG.10(e)

FIG.11
FIG.11(a)
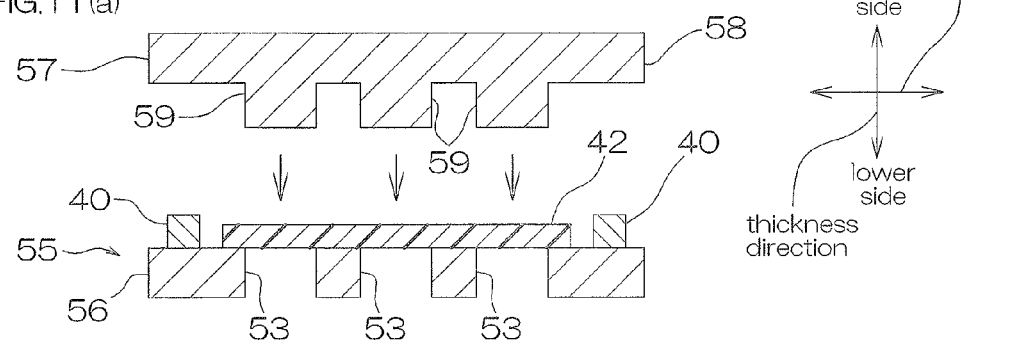
FIG.11(b)
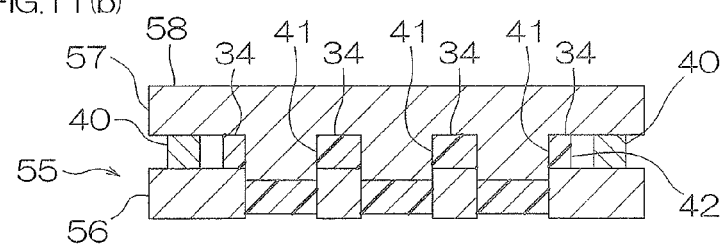
FIG.11(c)
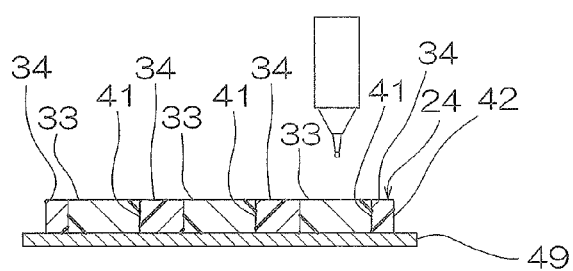
FIG.11(d)
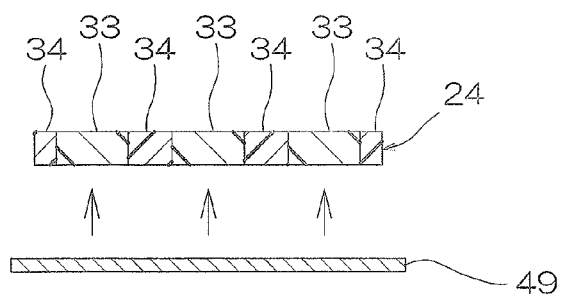

FIG.12
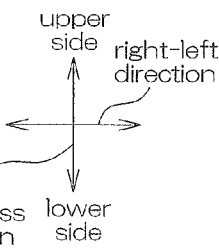
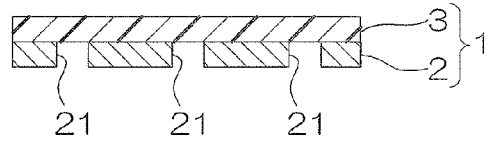
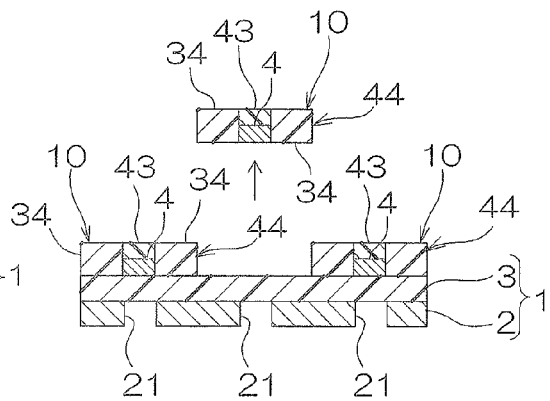
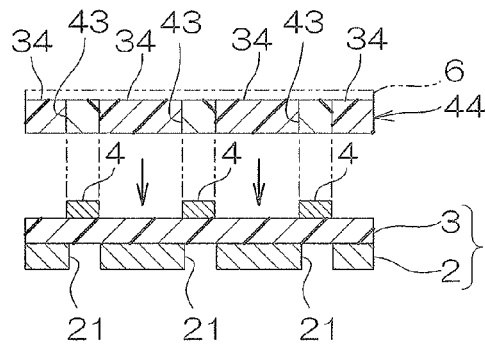
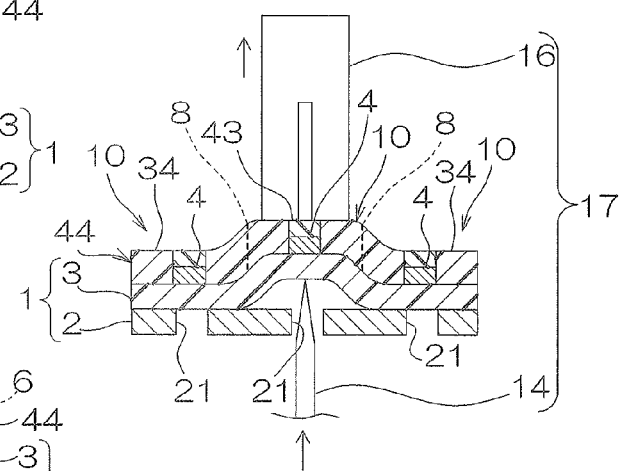
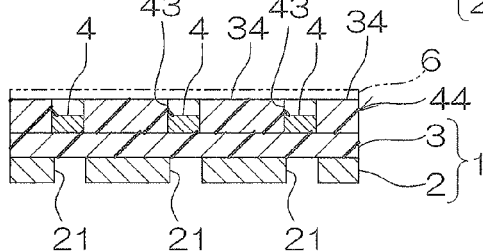
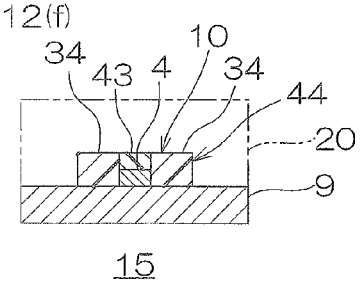
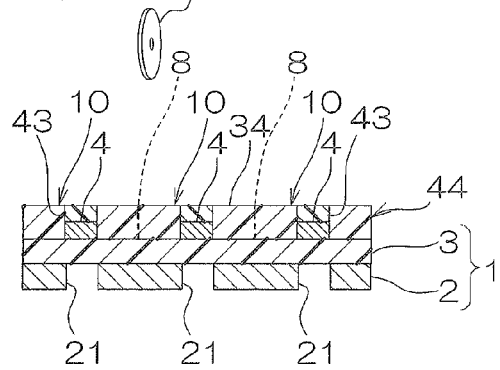

FIG.13
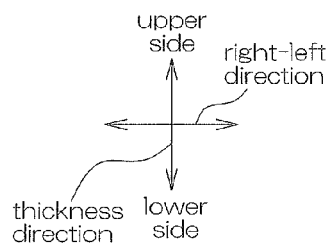
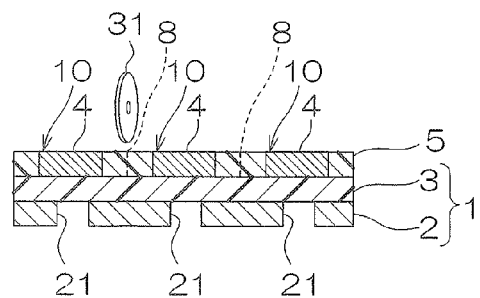
FIG.13(a)
FIG.13(b)
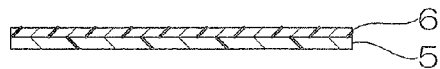
FIG.13(e)
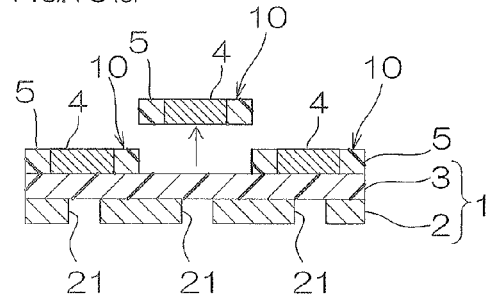
FIG.13(c)
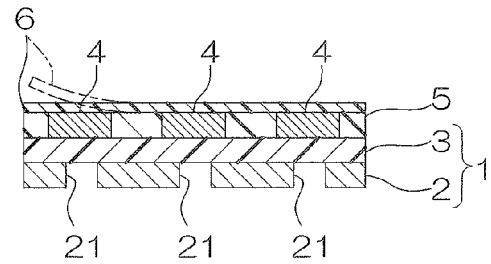
FIG.13(f)
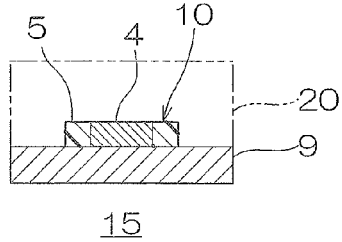

ENCAPSULATING LAYER-COVERED SEMICONDUCTOR ELEMENT, PRODUCING METHOD THEREOF, AND SEMICONDUCTOR DEVICE

CROSS-REFERENCE TO RELATED APPLICATION

The present application claims priority from Japanese Patent Applications No. 2012-147554 filed on Jun. 29, 2012 and No. 2013-015781 filed on Jan. 30, 2013, the contents of which are hereby incorporated by reference into this application.

BACKGROUND OF THE INVENTION

1. Field of the Invention

The present invention relates to an encapsulating layer-covered semiconductor element, a producing method thereof, and a semiconductor device, to be specific, to a method for producing an encapsulating layer-covered semiconductor element, an encapsulating layer-covered semiconductor element obtained by the method, and a semiconductor device including the encapsulating layer-covered semiconductor element.

2. Description of Related Art

It has been known that, conventionally, a semiconductor device including a light emitting diode device (hereinafter, abbreviated as an LED device), an electronic device, or the like is produced as follows: first, a plurality of semiconductor elements (including light emitting diode elements (hereinafter, abbreviated as LEDs), electronic elements, or the like) are mounted on a board; next, an encapsulating layer is provided so as to cover a plurality of the semiconductor elements; and thereafter, the resulting products are singulated into individual semiconductor elements.

Among all, when the semiconductor element is an LED and the semiconductor device is an LED device, unevenness in emission wavelength and luminous efficiency is generated between a plurality of the LEDs, so that in such an LED device mounted with the LED, there is a disadvantage that unevenness in light emission is generated between a plurality of the LEDs.

In order to solve such a disadvantage, it has been considered that, for example, a plurality of LEDs are covered with a phosphor layer to fabricate a plurality of phosphor layer-covered LEDs to be then singulated into each of the phosphor layer-covered LEDs as required. Thereafter, the phosphor layer-covered LED is selected in accordance with the emission wavelength and the luminous efficiency to be then mounted on a board.

For example, a chip is attached onto a flat and transparent board (a silica glass substrate) via a pressure-sensitive adhesive sheet and next, a resin is applied onto the chip to fabricate dummy wafers made of the chips covered with the resin.

Then, the pressure-sensitive adhesive force of the pressure-sensitive adhesive sheet is reduced by applying an ultraviolet ray from the side of the silica glass substrate, by a chemical solution, or by heating. Thereafter, the dummy wafers are peeled from the silica glass substrate and the pressure-sensitive adhesive sheet and then, the obtained dummy wafers are subjected to dicing on a chip basis to be singulated so as to produce a chip component. The chip component obtained by the above-described method has been proposed (ref: for example, Japanese Unexamined Patent Publication No. 2001-308116). The chip component in Japanese Unexamined Patent Publication No. 2001-308116 is to be then mounted on a board, so that a semiconductor device can be obtained.

SUMMARY OF THE INVENTION

In the method described in Japanese Unexamined Patent Publication No. 2001-308116, in order to peel the dummy wafers from the silica glass substrate and the pressure-sensitive adhesive sheet, the pressure-sensitive adhesive force of the pressure-sensitive adhesive sheet is reduced by applying the ultraviolet ray from the side of the silica glass substrate, by the chemical solution, or by heating.

Thus, there is a disadvantage that a material capable of being used in the pressure-sensitive adhesive sheet is limited or a step of reducing the pressure-sensitive adhesive force of the pressure-sensitive adhesive sheet is required, so that the number of production steps increases. As a result, an increase in the production cost for an encapsulating layer-covered semiconductor element is unavoidable.

It is an object of the present invention to provide a method for producing an encapsulating layer-covered semiconductor element in which a material used in a pressure-sensitive adhesive layer is capable of being widely selected, the freedom in process planning is improved, and furthermore, the number of steps required for the production of an encapsulating layer-covered semiconductor element is capable of being reduced; an encapsulating layer-covered semiconductor element obtained by the method; and a semiconductor device including the encapsulating layer-covered semiconductor element.

A method for producing an encapsulating layer-covered semiconductor element of the present invention includes a preparing step of preparing a support sheet including a hard support board formed with a through hole passing through in a thickness direction and a pressure-sensitive adhesive layer laminated on a surface at one side in the thickness direction of the support board so as to cover the through hole; a semiconductor element disposing step of disposing a semiconductor element on a surface at one side in the thickness direction of the pressure-sensitive adhesive layer in opposed to the through hole in the thickness direction; a semiconductor element covering step of covering the semiconductor element with an encapsulating layer to produce an encapsulating layer-covered semiconductor element including the semiconductor element and the encapsulating layer covering the semiconductor element; and a semiconductor element peeling step of inserting a pressing member into the through hole from the other side in the thickness direction to press the pressure-sensitive adhesive layer corresponding to the through hole relatively toward the one side in the thickness direction with respect to the support board so as to relatively move the encapsulating layer-covered semiconductor element toward the one side in the thickness direction and peel the encapsulating layer-covered semiconductor element from the pressure-sensitive adhesive layer.

In the method for producing an encapsulating layer-covered semiconductor element of the present invention, it is preferable that the encapsulating layer is formed of an encapsulating sheet.

In the method for producing an encapsulating layer-covered semiconductor element of the present invention, it is preferable that the semiconductor element covering step includes a layer disposing step of, after the semiconductor element disposing step, disposing the encapsulating layer formed from an encapsulating resin composition containing a curable resin at the one side in the thickness direction of the support sheet so as to embed the semiconductor element; an encapsulating step of curing the encapsulating layer to encapsulate the semiconductor element by the encapsulating layer that is flexible; and a cutting step of, after the encapsulating step, cutting the encapsulating layer that is flexible corresponding to the semiconductor element to produce the encapsulating layer-covered semiconductor element including the semiconductor element and the encapsulating layer covering the semiconductor element.

In the method for producing an encapsulating layer-covered semiconductor element of the present invention, it is preferable that in the layer disposing step, the semiconductor element is embedded by the encapsulating layer that is in a B-stage state and in the encapsulating step, the encapsulating layer is cured to be brought into a C-stage state and the semiconductor element is encapsulated by the encapsulating layer in a C-stage state.

In the method for producing an encapsulating layer-covered semiconductor element of the present invention, it is preferable that in the preparing step, the support sheet is prepared so that a reference mark, which serves as a reference of cutting in the cutting step, is provided in advance.

In the method for producing an encapsulating layer-covered semiconductor element of the present invention, it is preferable that the semiconductor element is an LED and the encapsulating layer is a phosphor layer.

In the method for producing an encapsulating layer-covered semiconductor element of the present invention, it is preferable that the encapsulating layer includes a cover portion that covers the semiconductor element and a reflector portion that contains a light reflecting component and is formed so as to surround the cover portion.

An encapsulating layer-covered semiconductor element of the present invention is obtained by a method for producing an encapsulating layer-covered semiconductor element including a preparing step of preparing a support sheet including a hard support board formed with a through hole passing through in a thickness direction and a pressure-sensitive adhesive layer laminated on a surface at one side in the thickness direction of the support board so as to cover the through hole; a semiconductor element disposing step of disposing a semiconductor element on a surface at one side in the thickness direction of the pressure-sensitive adhesive layer in opposed to the through hole in the thickness direction; a semiconductor element covering step of covering the semiconductor element with an encapsulating layer to produce an encapsulating layer-covered semiconductor element including the semiconductor element and the encapsulating layer covering the semiconductor element; and a semiconductor element peeling step of inserting a pressing member into the through hole from the other side in the thickness direction to press the pressure-sensitive adhesive layer corresponding to the through hole relatively toward the one side in the thickness direction with respect to the support board so as to relatively move the encapsulating layer-covered semiconductor element toward the one side in the thickness direction and peel the encapsulating layer-covered semiconductor element from the pressure-sensitive adhesive layer.

A semiconductor device of the present invention includes a board and an encapsulating layer-covered semiconductor element mounted on the board, wherein the encapsulating layer-covered semiconductor element is obtained by a method for producing an encapsulating layer-covered semiconductor element including a preparing step of preparing a support sheet including a hard support board formed with a through hole passing through in a thickness direction and a pressure-sensitive adhesive layer laminated on a surface at one side in the thickness direction of the support board so as to cover the through hole; a semiconductor element disposing step of disposing a semiconductor element on a surface at one side in the thickness direction of the pressure-sensitive adhesive layer in opposed to the through hole in the thickness direction; a semiconductor element covering step of covering the semiconductor element with an encapsulating layer to produce an encapsulating layer-covered semiconductor element including the semiconductor element and the encapsulating layer covering the semiconductor element; and a semiconductor element peeling step of inserting a pressing member into the through hole from the other side in the thickness direction to press the pressure-sensitive adhesive layer corresponding to the through hole relatively toward the one side in the thickness direction with respect to the support board so as to relatively move the encapsulating layer-covered semiconductor element toward the one side in the thickness direction and peel the encapsulating layer-covered semiconductor element from the pressure-sensitive adhesive layer.

In the method for producing an encapsulating layer-covered semiconductor element of the present invention, the pressing member is inserted into the through hole in the hard support board to press the pressure-sensitive adhesive layer, so that the semiconductor element is peeled from the pressure-sensitive adhesive layer.

Thus, the semiconductor element can be peeled from the pressure-sensitive adhesive layer without requiring a step of reducing the pressure-sensitive adhesive force of the pressure-sensitive adhesive layer before the semiconductor element peeling step.

As a result, the number of steps required for the production of the encapsulating layer-covered semiconductor element can be reduced.

Also, a material for forming the pressure-sensitive adhesive layer can be widely selected in addition to materials in which the pressure-sensitive adhesive force is capable of being reduced by application of ultraviolet ray, a chemical solution, or heating.

As a result, the freedom in process planning can be improved.

In the encapsulating layer-covered semiconductor element of the present invention, the number of steps required for the production thereof is reduced, so that its cost can be reduced.

The semiconductor device of the present invention includes the above-described encapsulating layer-covered semiconductor element, so that its cost can be reduced.

BRIEF DESCRIPTION OF THE DRAWINGS

FIG. 1 shows process drawings for illustrating a first embodiment of a method for producing an encapsulating layer-covered semiconductor element of the present invention:

FIG. 1(a) illustrating a step of preparing a support sheet (a preparing step),

FIG. 1(b) illustrating a step of disposing LEDs on a surface at the upper side of the support sheet (an LED disposing step), FIG. 1(c) illustrating a step of disposing a phosphor sheet on the surface at the upper side of the support sheet (a sheet disposing step), FIG. 1(d) illustrating a step of encapsulating the LEDs by the phosphor sheet (an encapsulating step) and a step of cutting the phosphor sheet (a cutting step), FIG. 1(e) illustrating a step of peeling phosphor sheet-covered LEDs from the support sheet (an LED peeling step), FIG. 1(e') illustrating a step of describing the details of a state of peeling the phosphor sheet-covered LEDs from a pressure-sensitive adhesive layer using a pick-up device in the LED peeling step in FIG. 1(e), and FIG. 1(f) illustrating a step of mounting the phosphor sheet-covered LED on a board (a mounting step).

FIG. 4 shows process drawings for illustrating a second embodiment of a method for producing an encapsulating layer-covered semiconductor element of the present invention:

FIG. 4(a) illustrating a step of preparing a support sheet (a preparing step),

FIG. 4(b) illustrating a step of disposing LEDs on the support sheet (an LED disposing step), FIG. 4(c) illustrating a step of embedding the LEDs by embedding portions of an embedding-reflector sheet (a sheet disposing step), FIG. 4(d) illustrating a step of encapsulating the LEDs by the embedding portions (an encapsulating step) and a step of cutting a reflector portion (a cutting step), FIG. 4(e) illustrating a step of peeling phosphor sheet-covered LEDs each including the reflector portion from the support sheet (an LED peeling step), FIG. 4(e') illustrating a step of describing the details of a state of peeling the phosphor sheet-covered LEDs from a pressure-sensitive adhesive layer using a pick-up device in the LED peeling step in FIG. 4(e), and FIG. 4(f) illustrating a step of mounting the phosphor sheet-covered LED including the reflector portion on a board (a mounting step).

FIG. 6(a) illustrating a step of disposing a reflector sheet on a pressing device, FIG. 6(b) illustrating a step of pressing the reflector sheet to form a reflector portion, FIG. 6(c) illustrating a step of disposing a phosphor sheet on the reflector portion, FIG. 6(d) illustrating a step of pressing the phosphor sheet to form embedding portions, and FIG. 6(e) illustrating a step of peeling the embedding-reflector sheet from a releasing sheet.

FIG. 7 shows process drawings for illustrating a method for producing an embedding-reflector sheet used in a third embodiment of a method for producing an encapsulating layer-covered semiconductor element of the present invention:

FIG. 7(a) illustrating a step of disposing a reflector sheet on a pressing device, FIG. 7(b) illustrating a step of pressing the reflector sheet to form a reflector portion, FIG. 7(c) illustrating a step of potting a varnish of a phosphor resin composition into through holes, and FIG. 7(d) illustrating a step of peeling the embedding-reflector sheet from a releasing sheet.

FIG. 8 shows process drawings for illustrating a fourth embodiment of a method for producing an encapsulating layer-covered semiconductor element of the present invention:

FIG. 8(a) illustrating a step of preparing a support sheet (a preparing step),

FIG. 8(b) illustrating a step of disposing LEDs on the support sheet (an LED disposing step), FIG. 8(c) illustrating a step of embedding the LEDs by embedding portions of an embedding-reflector sheet (a sheet disposing step), FIG. 8(d) illustrating a step of encapsulating the LEDs by the embedding portions (an encapsulating step) and a step of cutting a reflector portion (a cutting step), FIG. 8(e) illustrating a step of peeling phosphor sheet-covered LEDs each including the reflector portion from the support sheet (an LED peeling step), FIG. 8(e') illustrating a step of describing the details of a state of peeling the phosphor sheet-covered LEDs from a pressure-sensitive adhesive layer using a pick-up device in the LED peeling step in FIG. 8(e), and FIG. 8(f) illustrating a step of mounting the phosphor sheet-covered LED including the reflector portion on a board (a mounting step).

FIG. 9 shows process drawings for illustrating a fifth embodiment of a method for producing an encapsulating layer-covered semiconductor element of the present invention:

FIG. 9(a) illustrating a step of preparing a support sheet (a preparing step),

FIG. 9(b) illustrating a step of disposing LEDs on the support sheet (an LED disposing step), FIG. 9(c) illustrating a step of embedding the LEDs by embedding portions of an embedding-reflector sheet (a sheet disposing step), FIG. 9(d) illustrating a step of encapsulating the LEDs by the embedding portions (an encapsulating step) and a step of cutting a reflector portion (a cutting step), FIG. 9(e) illustrating a step of peeling phosphor sheet-covered LEDs each including the reflector portion from the support sheet (an LED peeling step), FIG. 9(e') illustrating a step of describing the details of a state of peeling the phosphor sheet-covered LEDs from a pressure-sensitive adhesive layer using a pick-up device in the LED peeling step in FIG. 9(e), and FIG. 9(f) illustrating a step of mounting the phosphor sheet-covered LED including the reflector portion on a board (a mounting step).

FIG. 10 shows process drawings for illustrating a method for producing the embedding-reflector sheet shown in FIG. 9(b):

FIG. 10(a) illustrating a step of disposing a reflector sheet on a punching device, FIG. 10(b) illustrating a step of stamping out the reflector sheet to form a reflector portion, FIG. 10(c) illustrating a step of disposing a phosphor sheet on the reflector portion, FIG. 10(d) illustrating a step of pressing the phosphor sheet to form embedding portions, and FIG. 10(e) illustrating a step of peeling the embedding-reflector sheet from a releasing sheet.

FIG. 11 shows process drawings for illustrating a method for producing an embedding-reflector sheet used in a sixth embodiment of a method for producing an encapsulating layer-covered semiconductor element of the present invention:

FIG. 11(a) illustrating a step of disposing a reflector sheet on a punching device, FIG. 11(b) illustrating a step of stamping out the reflector sheet to form a reflector portion, FIG. 11(c) illustrating a step of potting a varnish of a phosphor resin composition into through holes, and FIG. 11(d) illustrating a step of peeling the embedding-reflector sheet from a releasing sheet.

FIG. 12 shows process drawings for illustrating a seventh embodiment of a method for producing an encapsulating layer-covered semiconductor element of the present invention:

FIG. 12(*a*) illustrating a step of preparing a support sheet (a preparing step), FIG. 12(*b*) illustrating a step of disposing LEDs on the support sheet (an LED disposing step), FIG. 12(*c*) illustrating a step of covering the LEDs with cover portions (a covering step), FIG. 12(*d*) illustrating a step of curing the cover portions (a curing step) and a step of cutting a reflector portion (a cutting step), FIG. 12(*e*) illustrating a step of peeling phosphor sheet-covered LEDs each including the reflector portion from the support sheet (an LED peeling step), FIG. 12(*e'*) illustrating a step of describing the details of a state of peeling the phosphor sheet-covered LEDs from a pressure-sensitive adhesive layer using a pick-up device in the LED peeling step in FIG. 12(*e*), and FIG. 12(*f*) illustrating a step of mounting the phosphor sheet-covered LED including the reflector portion on a board (a mounting step).

FIG. 13 shows process drawings for illustrating an eighth embodiment of a method for producing an encapsulating layer-covered semiconductor element of the present invention:

FIG. 13(*a*) illustrating a step of preparing a support sheet (a preparing step), FIG. 13(*b*) illustrating a step of disposing LEDs on the support sheet (an LED disposing step), FIG. 13(*c*) illustrating a step of covering the side surfaces of the LEDs with a phosphor sheet (a sheet disposing step), FIG. 13(*d*) illustrating a step of curing the phosphor sheet (a curing step) and a step of cutting the phosphor sheet (a cutting step), FIG. 13(*e*) illustrating a step of peeling phosphor sheet-covered LEDs from the support sheet (an LED peeling step), FIG. 13(*e'*) illustrating a step of describing the details of a state of peeling the phosphor sheet-covered LEDs from a pressure-sensitive adhesive layer using a pick-up device in the LED peeling step in FIG. 13(*e*), and FIG. 13(*f*) illustrating a step of mounting the phosphor sheet-covered LED on a board (a mounting step).

DETAILED DESCRIPTION OF THE INVENTION

<First Embodiment>

In FIG. 1, the up-down direction of the paper surface is referred to as an up-down direction (a first direction, a thickness direction); the right-left direction of the paper surface is referred to as a right-left direction (a second direction, a direction perpendicular to the first direction); and the paper thickness direction of the paper is referred to as a front-rear direction (a third direction, a direction perpendicular to the first direction and the second direction). Directions and direction arrows in FIG. 2 and the subsequent figures are in conformity with the above-described directions and the direction arrows in FIG. 1.

Figure 2:
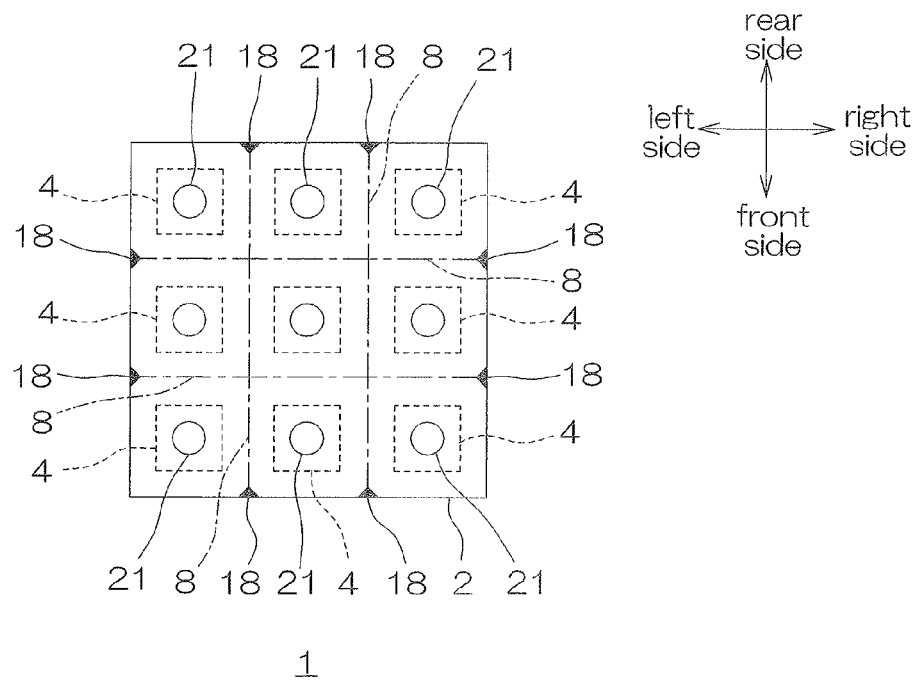
FIG. 2 shows a plan view of the support sheet shown in FIG. 1(a).

FIG. 1 shows process drawings for illustrating a first embodiment of a method for producing an encapsulating layer-covered semiconductor element of the present invention. FIG. 2 shows a plan view of the support sheet shown in FIG. 1(*a*).

In FIG. 2, a pressure-sensitive adhesive layer 3 to be described later is omitted so as to clearly show the relative arrangement of a support board 2 and a reference mark 18 to be described later.

As shown in FIGS. 1(*a*) to 1(*e*), a method for producing a phosphor sheet-covered LED 10 that is one example of a phosphor layer-covered LED as an encapsulating layer-covered semiconductor element includes a preparing step of a support sheet 1 (ref: FIG. 1(*a*)), an LED disposing step of disposing LEDs 4 as semiconductor elements (one example of a semiconductor element disposing step, ref: FIG. 1(*b*)), an LED covering step (one example of a semiconductor element covering step, ref: FIGS. 1(*c*) and 1(*d*)), and an LED peeling step (one example of a semiconductor element peeling step, ref: FIGS. 1(*e*) and 1(*e'*)).

The LED covering step includes a sheet disposing step (one example of a layer disposing step, ref: FIG. 1(*c*)) of, after the LED disposing step, disposing a phosphor sheet 5 as an encapsulating sheet that is one example of an encapsulating layer on the surface at the upper side (the upper surface) of the support sheet 1; an encapsulating step (ref: FIG. 1(*d*)) of curing the phosphor sheet 5 to encapsulate the LEDs 4 by the phosphor sheet 5; and a cutting step (ref: dashed lines in FIG. 1(*d*)) of, after the encapsulating step, cutting the phosphor sheet 5 corresponding to each of the LEDs 4 to produce the phosphor sheet-covered LEDs 10.

[Preparing Step]

The preparing step is a step of preparing the support sheet 1. As shown in FIGS. 1(*a*) and 2, the support sheet 1 is formed into a sheet shape extending in the plane direction (a direction perpendicular to the thickness direction, that is, the right-left direction and the front-rear direction). The support sheet 1 is formed into, for example, a rectangular shape in plane view (a shape when projected in the thickness direction).

The support sheet 1 is prepared so that the reference marks 18, which serve as a reference of cutting in the cutting step to be described later, are provided in advance.

As shown in FIG. 2, a plurality of the reference marks 18 are provided at spaced intervals to each other at the circumference end portion in the plane direction of the support sheet 1. The reference marks 18 are, for example, provided at two sides that are opposed to each other in the support sheet 1. The reference marks 18 are formed to make a pair opposing to each other in an opposing direction of the two sides of the support sheet 1. One pair of the reference marks 18 is provided corresponding to the LEDs 4 that are subsequently disposed and is disposed so as to be capable of singulating the LEDs 4 when the phosphor sheet 5 is cut with the reference marks 18 as a reference.

Each of the reference marks 18 is formed into a shape that is easily recognized in plane view and is, for example, formed into a generally triangular shape in plane view.

The maximum length of the support sheet 1 is, for example, 10 mm or more and 300 mm or less.

The support sheet 1 is configured to be capable of supporting the LEDs 4 (ref: FIG. 1(*b*)) to be described next and as shown in FIGS. 1(*a*) and 2, includes, for example, the support board 2 and the pressure-sensitive adhesive layer 3 that is laminated on the surface at the upper side of the support board 2.

The support board 2 is formed into a plate shape extending in the plane direction. The support board 2 is provided in the lower portion of the support sheet 1 and is formed to have the generally same shape as that of the support sheet 1 in plane view.

In the surface at the upper side of the support board 2, the reference marks 18 are formed. The reference marks 18 are, in sectional view, though not shown, formed as concave portions that dent from the surface at the upper side of the support board 2 toward the middle in the up-down direction thereof or as holes that pass through in the up-down direction thereof.

The support board 2 is formed of a hard material. To be specific, examples of the material include an oxide such as a silicon oxide (silica or the like) and alumina, a metal such as stainless steel, and silicon.

The support board 2 has a Young's modulus at 23° C. of, for example, $1 \times 10^6$ Pa or more, preferably $1 \times 10^7$ Pa or more, or more preferably $1 \times 10^8$ Pa or more, and of, for example, $1 \times 10^{12}$ Pa or less. When the Young's modulus of the support board 2 is not less than the above-described lower limit, hardness of the support board 2 is secured and the LEDs 4 (ref: FIG. 1(*b*)) to be described later can be further surely supported. The Young's modulus of the support board 2 is obtained by, for example, the compressive elastic modulus in JIS H 7902:2008.

The thickness of the support board 2 is, for example, 0.1 mm or more, or preferably 0.3 mm or more, and is, for example, 5 mm or less, or preferably 2 mm or less.

In the support board 2, through holes 21 for allowing a pressing member 14 to insert thereinto in the LED peeling step to be described later are formed.

As shown in FIG. 2, a plurality of the through holes 21 are provided at spaced intervals to each other in the support board 2 corresponding to the LEDs 4 that are subsequently disposed. The through holes 21 are, for example, disposed so as to allow each of the phosphor sheet-covered LEDs 10 to be pressed when the phosphor sheet-covered LEDs 10 are singulated with the reference marks 18 as a reference.

To be more specific, a plurality of the through holes 21 are disposed in alignment in the support sheet 1 so as to be spaced apart from each other at equal intervals in the front-rear and the right-left directions in plane view.

The shape of each of the through holes 21 is, for example, formed into a circular shape in plane view. In the size thereof, the hole diameter is, for example, 0.1 mm or more, or preferably 0.2 mm or more, and is, for example, 1 mm or less, or preferably 0.7 mm or less.

The size of each of the through holes 21 with respect to that of each of the LEDs 4 is, for example, 10% or more, or preferably 20% or more, and is, for example, 90% or less, or preferably 80% or less.

The pressure-sensitive adhesive layer 3 is formed on the entire surface at the upper side of the support board 2.

That is, the pressure-sensitive adhesive layer 3 is laminated on the surface at the upper side (the surface at one side in the thickness direction) of the support board 2 so as to cover the through holes 21.

An example of a pressure-sensitive adhesive material for forming the pressure-sensitive adhesive layer 3 includes a pressure-sensitive adhesive such as an acrylic pressure-sensitive adhesive and a silicone pressure-sensitive adhesive.

The pressure-sensitive adhesive material can be widely selected from materials that can be usually used as a pressure-sensitive adhesive, in addition to materials in which the pressure-sensitive adhesive force is capable of being reduced by application of ultraviolet ray, a chemical solution, or heating.

The thickness of the pressure-sensitive adhesive layer 3 is, for example, 0.1 mm or more, or preferably 0.2 mm or more, and is, for example, 1 mm or less, or preferably 0.5 mm or less.

In order to prepare the support sheet 1, for example, the support board 2 is attached to the pressure-sensitive adhesive layer 3.

The thickness of the support sheet 1 is, for example, 0.2 mm or more, or preferably 0.5 mm or more, and is, for example, 6 mm or less, or preferably 2.5 mm or less.

[LED Disposing Step]

The LED disposing step is a step of disposing the LEDs 4 on the pressure-sensitive adhesive layer 3. As shown in FIG. 1(*b*) and by phantom lines in FIG. 2, a plurality of the LEDs 4 are prepared to be disposed on the surface at the upper side (the surface at one side in the thickness direction) of the support sheet 1.

The LEDs 4 are semiconductor elements that convert electrical energy to light energy. Each of the LEDs 4 is, for example, formed into a generally rectangular shape in sectional view and a generally rectangular shape in plane view with the thickness shorter than the length in the plane direction (the maximum length). The surface at the lower side (the lower surface) of each of the LEDs 4 is formed of a bump that is not shown. An example of the LEDs 4 includes blue light emitting diode elements that emit blue light.

The maximum length in the plane direction of each of the LEDs 4 is, for example, 0.1 mm or more and 3 mm or less. The thickness thereof is, for example, 0.05 mm or more and 1 mm or less.

In the LED disposing step, for example, a plurality of the LEDs 4 are disposed in alignment on the surface at the upper side of the support sheet 1. To be specific, a plurality of the LEDs 4 are disposed in such a manner that a plurality of the LEDs 4 are arranged at equal intervals to each other in the front-rear and the right-left directions in plane view.

The LEDs 4 are disposed on the surface at the upper side (the surface at one side in the thickness direction) of the pressure-sensitive adhesive layer 3 so as to be opposed to the through holes 21 in the thickness direction and the LEDs 4 are attached to the pressure-sensitive adhesive layer 3 so that the bumps thereof that are not shown are opposed to the support sheet 1. In this way, the LEDs 4 are supported by the surface at the upper side of the support board 2 via the pressure-sensitive adhesive layer 3 so that the alignment state thereof is retained.

Each of the LEDs 4 is disposed so that each of the corresponding through holes 21 is positioned at the center thereof.

The gap between the LEDs 4 is, for example, 0.05 mm or more and 2 mm or less.

[LED Covering Step]

The LED covering step is a step of covering the surfaces of the LEDs 4 with the phosphor sheet 5 to produce the phosphor sheet-covered LEDs 10, each of which includes the LED 4 and the phosphor sheet 5 covering the surfaces of the LED 4. The LED covering step includes a sheet disposing step, an encapsulating step, and a cutting step.

(Sheet Disposing Step)

The sheet disposing step is a step of, after the LED disposing step, disposing the phosphor sheet 5 on the support sheet 1 so as to embed the LEDs 4. In FIG. 1(*c*), the phosphor sheet 5 is formed from a phosphor resin composition containing a curable resin and a phosphor into a sheet shape.

Examples of the curable resin include a thermosetting resin that is cured by heating and an active energy ray curable resin that is cured by application of an active energy ray (for example, an ultraviolet ray and an electron beam). Preferably, a thermosetting resin is used.

To be specific, an example of the curable resin includes a thermosetting resin such as a silicone resin, an epoxy resin, a polyimide resin, a phenol resin, a urea resin, a melamine resin, and an unsaturated polyester resin. Preferably, a silicone resin is used.

An example of the silicone resin includes a silicone resin such as a two-step curable type silicone resin and a one-step curable type silicone resin. Preferably, a two-step curable type silicone resin is used.

The two-step curable type silicone resin is a thermosetting silicone resin that has a two-step reaction mechanism and in which a silicone resin is brought into a B-stage state (a semi-cured state) in the first-step reaction and is brought into a C-stage state (a completely cured state) in the second-step reaction. On the other hand, the one-step curable type silicone resin is a thermosetting silicone resin that has a one-step reaction mechanism and in which a silicone resin is completely cured in the first-step reaction.

The B-stage state is a state between an A-stage state in which a thermosetting silicone resin is in a liquid state and a C-stage state in which the thermosetting silicone resin is completely cured. Also, the B-stage state is a state in which the curing and the gelation of the thermosetting silicone resin are slightly progressed and the compressive elastic modulus thereof is smaller than the elastic modulus thereof in a C-stage state.

An example of the two-step curable type silicone resin includes a condensation reaction and addition reaction curable type silicone resin that has two reaction systems of a condensation reaction and an addition reaction.

The mixing ratio of the curable resin with respect to the phosphor resin composition is, for example, 30 mass % or more, or preferably 50 mass % or more, and is, for example, 99 mass % or less, or preferably 95 mass % or less.

The phosphor has a wavelength conversion function and examples thereof include a yellow phosphor that is capable of converting blue light into yellow light and a red phosphor that is capable of converting blue light into red light.

Examples of the yellow phosphor include a garnet type phosphor having a garnet type crystal structure such as $Y_3Al_5O_{12}$:Ce (YAG (yttrium aluminum garnet):Ce) and $Tb_3Al_3O_{12}$:Ce (TAG (terbium aluminum garnet):Ce) and an oxynitride phosphor such as Ca-α-SiAlON.

An example of the red phosphor includes a nitride phosphor such as $CaAlSiN_3$:Eu and $CaSiN_2$:Eu.

Preferably, a yellow phosphor is used.

Examples of a shape of the phosphor include a sphere shape, a plate shape, and a needle shape. Preferably, in view of fluidity, a sphere shape is used.

The average value of the maximum length (in the case of a sphere shape, the average particle size) of the phosphor is, for example, 0.1 μm or more, or preferably 1 μm or more, and is, for example, 200 μm or less, or preferably 100 μm or less.

The mixing ratio of the phosphor with respect to 100 parts by mass of the curable resin is, for example, 0.1 parts by mass or more, or preferably 0.5 parts by mass or more, and is, for example, 80 parts by mass or less, or preferably 50 parts by mass or less.

Furthermore, the phosphor resin composition can also contain a filler.

Examples of the filler include organic microparticles such as silicone particles and inorganic microparticles such as silica, talc, alumina, aluminum nitride, and silicon nitride. The mixing ratio of the filler with respect to 100 parts by mass of the curable resin is, for example, 0.1 parts by mass or more, or preferably 0.5 parts by mass or more, and is, for example, 70 parts by mass or less, or preferably 50 parts by mass or less.

As shown in FIG. 1(c), in order to dispose the phosphor sheet 5 on the support sheet 1, first, as shown in FIG. 1(b), the phosphor sheet 5 is prepared. In order to prepare the phosphor sheet 5, a curable resin and a phosphor, and a filler, which is blended as required, are blended to prepare a phosphor resin composition. Next, the phosphor resin composition is applied to the surface of a release sheet 6 to be then heated. Examples of the release sheet 6 include a polymer film such as a polyethylene film and a polyester film (PET or the like), a ceramic sheet, and a metal foil. Preferably, a polymer film is used. The surface of the release sheet 6 can be also subjected to release treatment such as fluorine treatment.

When the curable resin contains a two-step curable type silicone resin, the curable resin is brought into a B-stage state (a semi-cured state) by the above-described heating. That is, the phosphor sheet 5 in a B-stage state is formed.

The phosphor sheet 5 has a compressive elastic modulus at 23° C. of, for example, 0.01 MPa or more, or preferably 0.04 MPa or more, and of, for example, 1.0 MPa or less, or preferably 0.5 MPa or less.

When the compressive elastic modulus of the phosphor sheet 5 is not more than the above-described upper limit, sufficient flexibility can be secured. On the other hand, when the compressive elastic modulus of the phosphor sheet 5 is not less than the above-described lower limit, the LEDs 4 can be embedded.

Next, as shown in FIG. 1(c), the phosphor sheet 5 is disposed on the surface at the upper side of the support sheet 1 so as to embed the LEDs 4 (an embedding step). That is, the phosphor sheet 5 is disposed on the support sheet 1 so as to cover the upper surfaces and the side surfaces of the LEDs 4.

To be specific, as shown by arrows in FIG. 1(b), the phosphor sheet 5 laminated on the release sheet 6 is compressively bonded toward the pressure-sensitive adhesive layer 3.

In this way, in the sheet disposing step, the embedding step in which the LEDs 4 are embedded by the phosphor sheet 5 is performed.

Thereafter, as shown by the phantom line in FIG. 1(c), the release sheet 6 is peeled from the surface at the upper side of the phosphor sheet 5.

(Encapsulating Step)

The encapsulating step is a step of curing the phosphor sheet 5 to encapsulate the LEDs 4 by the phosphor sheet 5 that is flexible. The encapsulating step is performed after the sheet disposing step (ref: FIG. 1(c)).

In the encapsulating step, as shown in FIG. 1(d), the phosphor sheet 5 is cured. To be specific, the phosphor sheet 5 is heated at, for example, 80° C. or more, or preferably 100° C. or more, and at, for example, 200° C. or less, or preferably 180° C. or less.

When the thermosetting resin contains a two-step curable type silicone resin and when the phosphor sheet 5 that embeds the LEDs 4 is in a B-stage state, the phosphor sheet 5 is completely cured (subjected to a final curing) to be brought into a C-stage state by the above-described heating.

When the curable resin contains a one-step curable type silicone resin, the phosphor sheet 5 that is made from the curable resin is completely cured (subjected to a final curing) to be brought into a C-stage state by the above-described heating.

When the curable resin is an active energy ray curable resin, an active energy ray is applied to the phosphor sheet 5 from the upper side.

The cured (completely cured) phosphor sheet 5 has flexibility. To be specific, the cured (completely cured) phosphor sheet 5 has a compressive elastic modulus at 23° C. of, for example, 0.5 MPa or more, or preferably 1 MPa or more, and of, for example, 100 MPa or less, or preferably 10 MPa or less.

When the compressive elastic modulus of the phosphor sheet 5 is not more than the above-described upper limit, the flexibility can be surely secured and in the cutting step (ref: FIG. 1(d)) to be described next, for example, the phosphor sheet 5 can be cut using a cutting device (described later). When the compressive elastic modulus of the phosphor sheet 5 is not less than the above-described lower limit, the shape thereof after being cut can be retained.

In this way, the side surfaces and the upper surfaces of the LEDs 4, and a portion of the surface at the upper side of the pressure-sensitive adhesive layer 3 that is exposed from the LEDs 4 are covered with the phosphor sheet 5 in close contact with each other. That is, the LEDs 4 are encapsulated by the phosphor sheet 5 in a C-stage state.

(Cutting Step)

The cutting step is a step of, after the encapsulating step, cutting the phosphor sheet 5 corresponding to each of the LEDs 4 to produce the phosphor sheet-covered LEDs 10, each of which includes the LED 4 and the phosphor sheet 5. As shown by the dashed lines in FIG. 1(d), in the cutting step, the flexible phosphor sheet 5 around the LEDs 4 is cut along the thickness direction. As shown by dash-dot lines in FIG. 2, for example, the phosphor sheet 5 is cut into a generally rectangular shape in plane view that surrounds each of the LEDs 4.

In order to cut the phosphor sheet 5, for example, a dicing device using a disc-shaped dicing saw (dicing blade) 31 (ref: FIG. 1(d)), a cutting device using a cutter, a laser irradiation device, or the like is used.

The cutting of the phosphor sheet 5 is performed with the reference marks 18 as a reference. To be specific, the phosphor sheet 5 is cut so as to form cuts 8 along the straight lines (shown by the dash-dot lines in FIG. 2) that connect the reference marks 18 making one pair.

In the cutting of the phosphor sheet 5, for example, the phosphor sheet 5 is cut from the upper side toward the lower side so that the cuts 8 fail to pass through the support sheet 1, to be specific, fail to pass through the pressure-sensitive adhesive layer 3.

By the cutting step, the phosphor sheet-covered LEDs 10, each of which includes the LED 4 and the phosphor sheet 5 that is formed as an encapsulating layer formed of the phosphor sheet 5 so as to cover the surfaces of the LED 4, are obtained in a state of being in close contact with the support sheet 1.

[LED Peeling Step]

As shown in FIG. 1(e), the LED peeling step is a step of peeling each of the phosphor sheet-covered LEDs 10 from the pressure-sensitive adhesive layer 3. As shown in FIG. 1(e'), using a pick-up device 17 that is provided with the pressing member 14 such as a needle and an absorbing member 16 such as a collet, the pressure-sensitive adhesive layer 3 is pressed by the pressing member 14 via the through hole 21, so that each of the phosphor sheet-covered LEDs 10 is peeled from the support board 2 and the pressure-sensitive adhesive layer 3.

To be specific, first, the support sheet 1 is placed in the pick-up device 17. Then, the pressing member 14 is disposed from the lower side (the other side in the thickness direction) in opposed relation to the through hole 21 corresponding to the phosphor sheet-covered LED 10 that is intended to be peeled off.

Then, the pressing member 14 is inserted into the through hole 21 from the lower side.

Then, the pressure-sensitive adhesive layer 3 corresponding to the through hole 21 is pressed relatively toward the upper side (one side in the thickness direction) with respect to the support board 2 and the pressure-sensitive adhesive layer 3 is pushed up along with the phosphor sheet-covered LED 10.

The pushed-up phosphor sheet-covered LED 10 is absorbed by the absorbing member 16.

The phosphor sheet-covered LED 10 is absorbed by the absorbing member 16 and is further moved relatively toward the upper side (one side in the thickness direction) with respect to the support board 2. Thereafter, the phosphor sheet-covered LED 10 is peeled from the pressure-sensitive adhesive layer 3.

Before the LED peeling step, the pressure-sensitive adhesive force of the pressure-sensitive adhesive layer 3 is reduced by application of ultraviolet ray, a chemical solution, or heating as required and then, each of the phosphor sheet-covered LEDs 10 can be also peeled off.

In this way, as shown in FIG. 1(e), each of the phosphor sheet-covered LEDs 10 that is peeled from the support sheet 1 is obtained.

[Mounting Step]

The mounting step is a step of, after the LED peeling step, mounting the phosphor sheet-covered LED 10 on a board 9. After the phosphor sheet-covered LED 10 is selected in accordance with emission wavelength and luminous efficiency, as shown in FIG. 1(f), the selected phosphor sheet-covered LED 10 is mounted on the board 9. In this way, an LED device 15 as a semiconductor device is obtained.

To be specific, the phosphor sheet-covered LED 10 is disposed in opposed relation to the board 9 so that a bump (not shown) in the LED 4 is opposed to a terminal (not shown) provided on the surface at the upper side of the board 9. That is, the LED 4 in the phosphor sheet-covered LED 10 is flip-chip mounted on the board 9.

In this way, the LED device 15 including the board 9 and the phosphor sheet-covered LED 10 that is mounted on the board 9 is obtained.

Thereafter, as shown by the phantom line in FIG. 1(f), an encapsulating protective layer 20 (an encapsulating layer that is different from the phosphor sheet 5) that encapsulates the phosphor sheet-covered LED 10 is provided in the LED device 15 as required. In this way, reliability of the LED device 15 can be improved.

According to the method for producing the phosphor sheet-covered LED 10, in the preparing step, the hard support board 2 in which the through holes 21 are formed in advance is prepared and in the LED peeling step, using the above-described pick-up device 17, the pressing member 14 is inserted into the through hole 21 in the support board 2 to press the pressure-sensitive adhesive layer 3, so that each of the phosphor sheet-covered LEDs 10 is peeled from the pressure-sensitive adhesive layer 3.

Thus, each of the LEDs 4 can be peeled from the pressure-sensitive adhesive layer 3 without requiring a step in which the pressure-sensitive adhesive force of the pressure-sensitive adhesive layer 3 is reduced before the LED peeling step.

As a result, the number of steps required for the production of the phosphor sheet-covered LED 10 can be reduced.

Also, a material for forming the pressure-sensitive adhesive layer 3 can be widely selected in addition to materials in which the pressure-sensitive adhesive force is capable of being reduced by application of ultraviolet ray, a chemical solution, or heating.

As a result, the freedom in process planning can be improved.

On the other hand, the method for producing the phosphor sheet-covered LED 10 includes the cutting step and after the cutting step, each of the phosphor sheet-covered LEDs 10 is peeled from the support sheet 1. That is, in the cutting step, the phosphor sheet 5 is capable of being cut, while the LEDs 4 and the phosphor sheet 5 are supported by the support sheet 1 including the hard support board 2. Thus, the phosphor sheet-covered LED 10 having excellent size stability can be obtained.

After the encapsulating step in which the phosphor sheet 5 is cured, the cutting step in which the phosphor sheet 5 is cut is performed, so that a dimensional deviation caused by shrinkage of the phosphor sheet 5 that may occur in the curing can be cancelled in the cutting step. Thus, the phosphor sheet-covered LED 10 having further excellent size stability can be obtained.

In addition, the phosphor sheet 5 that encapsulates the LEDs 4 is flexible, so that in the cutting step, the phosphor sheet 5 is capable of being smoothly cut not only using an expensive dicing device, but also using various cutting devices including a relatively cheap cutting device.

In addition, in the sheet disposing step in this method, the LEDs 4 are embedded by the phosphor sheet 5 in a B-stage state; in the encapsulating step, the phosphor sheet 5 is cured to be brought into a C-stage state; and the phosphor sheet 5 in a C-stage state encapsulates the LEDs 4. Thus, the LEDs 4 are easily and surely covered with the phosphor sheet 5 in a B-stage state and the phosphor sheet 5 in a C-stage state is capable of surely encapsulating the LEDs 4.

Consequently, the phosphor sheet-covered LED 10 has excellent size stability.

In the phosphor sheet-covered LED 10, the number of steps required for the production thereof is reduced, so that its cost can be reduced.

The LED device 15 includes the above-described phosphor sheet-covered LED 10, so that its cost can be reduced.

In the preparing step in this method, the support sheet 1 is prepared so that the reference marks 18, which serve as a reference of cutting in the cutting step, are provided in advance.

On the other hand, in the method described in Japanese Unexamined Patent Publication No. 2001-308116 in which dummy wafers are peeled from a silica glass substrate or a pressure-sensitive adhesive sheet to be then subjected to dicing, the dummy wafers are not on the silica glass substrate when subjected to dicing and thus, the dicing is not capable of being performed with the above-described reference marks 18 as a reference.

In contrast, in the above-described method, the LEDs 4 are supported by the support sheet 1 in the cutting step, so that in this way, the LEDs 4 can be singulated with excellent accuracy with the reference marks 18 as a reference.

<Modified Example>

In the first embodiment, as shown in FIG. 2, each of the through holes 21 is formed into a circular shape in plane view. However, the shape thereof is not particularly limited and can be formed into an appropriate shape such as a generally rectangular shape in plane view or a generally triangular shape in plane view.

In the first embodiment, as shown in FIG. 2, each of the reference marks 18 is formed into a generally triangular shape in plane view. However, the shape thereof is not particularly limited and can be formed into an appropriate shape such as a generally circular shape in plane view, a generally rectangular shape in plane view, a generally X-shape in plane view, and a generally T-shape in plane view.

In the first embodiment, first, in the cutting step, a plurality of the LEDs 4 and the phosphor sheet 5 that covers the surfaces of a plurality of the LEDs 4 (hereinafter, these are defined as phosphor sheet-covered LEDs 10') are singulated into each of the phosphor sheet-covered LEDs 10. Next, in the LED peeling step, each of the phosphor sheet-covered LEDs 10 is peeled from the pressure-sensitive adhesive layer 3. Alternatively, in the cutting step, the phosphor sheet-covered LEDs 10' are not sigulated and in the LED peeling step, the phosphor sheet-covered LEDs 10' can be peeled from the pressure-sensitive adhesive layer 3.

Figure 3:
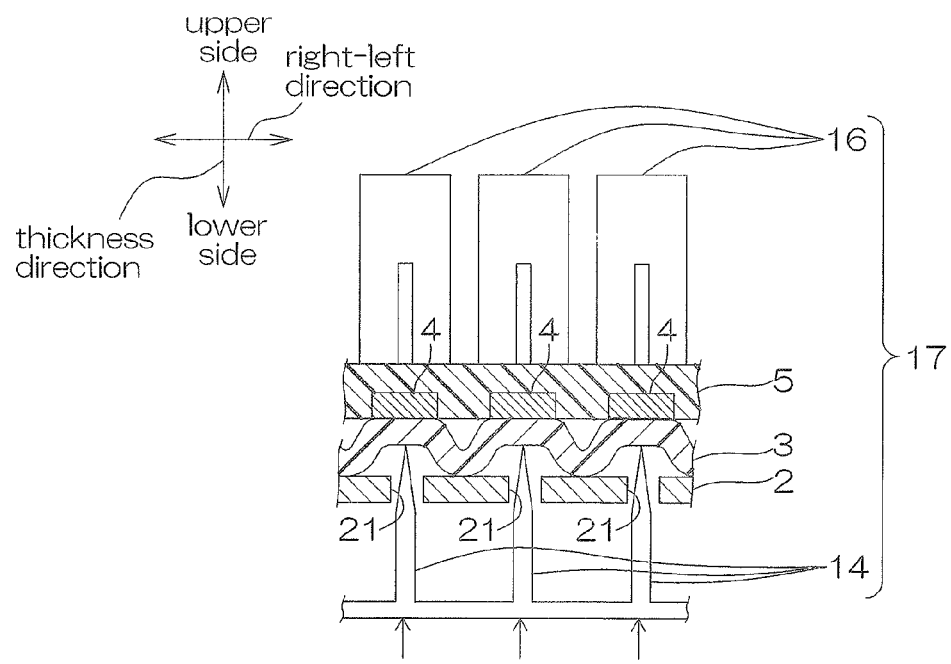
FIG. 3 shows a modified example of the LED peeling step shown in FIGS. 1(e) and 1(e') and shows a modified example of peeling a plurality of phosphor sheet-covered LEDs that are not singulated.

FIG. 3 shows a modified example of the LED peeling step shown in FIGS. 1(*e*) and 1(*e'*) and shows a modified example of peeling the phosphor sheet-covered LEDs 10' (a plurality of the phosphor sheet-covered LEDs 10 that are not singulated).

In the modified example, as shown in FIG. 3, the pick-up device 17 is provided with a plurality of the pressing members 14 and a plurality of the absorbing members 16 corresponding to a plurality of the LEDs 4. A plurality of the pressing members 14 move relative to one another in the up-down direction at the same time.

In order to peel the phosphor sheet-covered LEDs 10', first, the phosphor sheet-covered LEDs 10' are placed in the pick-up device 17 and each of a plurality of the pressing members 14 is disposed from the lower side (the other side in the thickness direction) in opposed relation to each of a plurality of the through holes 21.

A plurality of the pressing members 14 are simultaneously inserted into a plurality of the through holes 21 from the lower side.

Then, the entire pressure-sensitive adhesive layer 3 is pressed relatively toward the upper side (one side in the thickness direction) with respect to the support board 2 and the entire pressure-sensitive adhesive layer 3 is pushed up along with the phosphor sheet-covered LEDs 10'.

The pushed-up phosphor sheet-covered LEDs 10' are absorbed by a plurality of the absorbing members 16.

The phosphor sheet-covered LEDs 10' are absorbed by a plurality of the absorbing members 16 and are further moved relatively toward the upper side (one side in the thickness direction) with respect to the support board 2. Thereafter, the phosphor sheet-covered LEDs 10' are peeled from the pressure-sensitive adhesive layer 3.

Furthermore, in the first embodiment, a plurality of the LEDs 4 are covered with and encapsulated by the phosphor sheet 5. Alternatively, for example, a single piece of the LED 4 can be covered with and encapsulated by the phosphor sheet 5.

In such a case, to be specific, in the cutting step shown in FIG. 1(*d*) that is illustrated in the first embodiment, the phosphor sheet 5 around the LED 4 is trimmed (subjected to trimming) so as to have a desired size.

<Second Embodiment>

Figure 5:
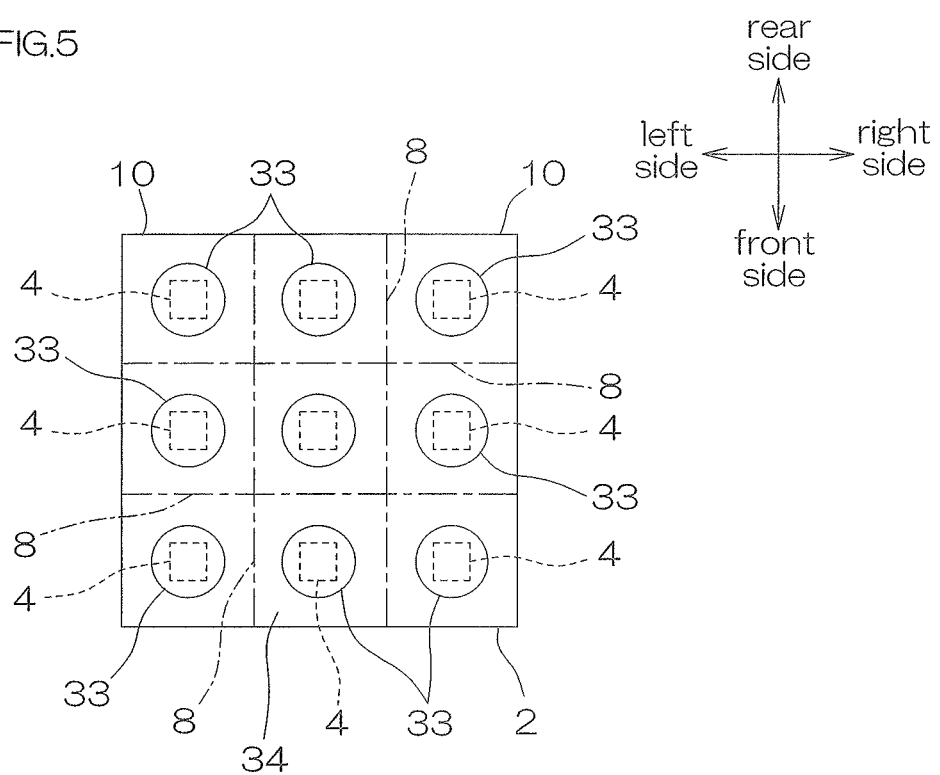
FIG. 5 shows a plan view of the phosphor sheet-embedded LEDs shown in FIG. 4(d).
Figure 6:
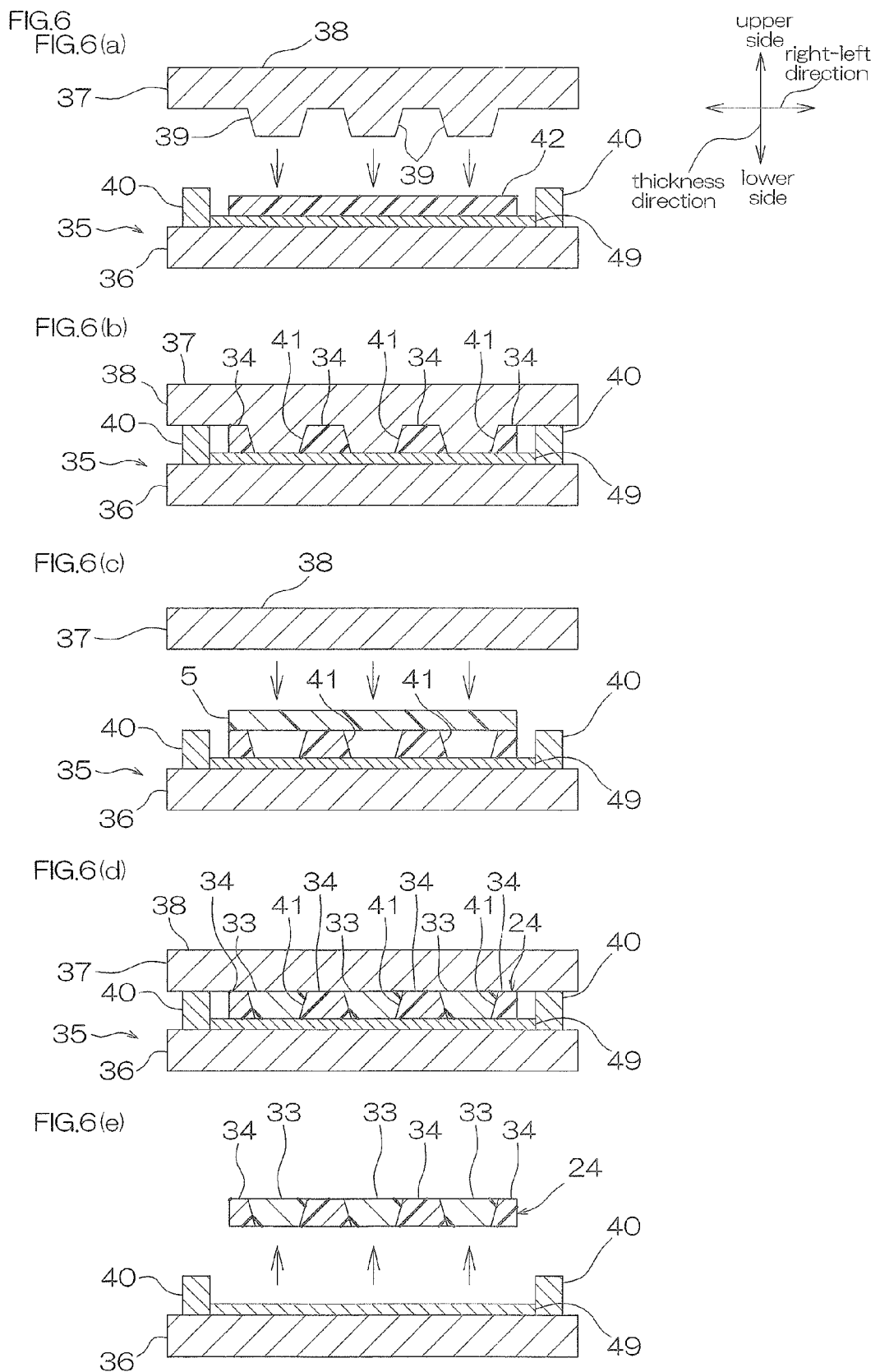
FIG. 6 shows process drawings for illustrating a method for producing the embedding-reflector sheet shown in FIG. 4(b)

FIG. 4 shows process drawings for illustrating a second embodiment of a method for producing an encapsulating layer-covered semiconductor element of the present invention. FIG. 5 shows a plan view of the phosphor sheet-embedded LEDs shown in FIG. 4(*d*). FIG. 6 shows process drawings for illustrating a method for producing the embedding-reflector sheet shown in FIG. 4(*b*).

In the second embodiment, the same reference numerals are provided for members and steps corresponding to each of those in the first embodiment, and their detailed description is omitted.

In the first embodiment, as shown in FIG. 1(b), the phosphor sheet 5 in which a phosphor is uniformly (uniformly at least in the plane direction) dispersed is illustrated as an encapsulating sheet that is one example of the encapsulating layer of the present invention. Alternatively, for example, as shown in FIGS. 4(b) and 5, an embedding-reflector sheet 24 that includes embedding portions 33 containing a phosphor as cover portions and a reflector portion 34 surrounding the embedding portions 33 can be also illustrated as an encapsulating sheet.

As shown in FIG. 5, a plurality of the embedding portions 33 are provided at spaced intervals to each other as portions that embed a plurality of the LEDs 4 in the embedding-reflector sheet 24. Each of the embedding portions 33 is formed into a generally circular shape in plane view. To be specific, as shown in FIG. 4(b), each of the embedding portions 33 is formed into a generally conical trapezoidal shape in which its width is gradually reduced toward the lower side.

The diameter (the maximum length) of the lower end portion of each of the embedding portions 33 is larger than the maximum length in the plane direction of each of the LEDs 4. To be specific, the diameter (the maximum length) of the lower end portion thereof with respect to the maximum length in the plane direction of each of the LEDs 4 is, for example, 200% or more, preferably 300% or more, or more preferably 500% or more, and is, for example, 3000% or less. To be more specific, the diameter (the maximum length) of the lower end portion of each of the embedding portions 33 is, for example, 5 mm or more, or preferably 7 mm or more, and is, for example, 300 mm or less, or preferably 200 mm or less.

The diameter (the maximum length) of the upper end portion of each of the embedding portions 33 is larger than the diameter (the maximum length) of the lower end portion thereof. To be specific, the diameter (the maximum length) of the upper end portion thereof is, for example, 7 mm or more, or preferably 10 mm or more, and is, for example, 400 mm or less, or preferably 250 mm or less.

The gap between the embedding portions 33 (the minimum gap, to be specific, the gap between the upper end portions of the embedding portions 33) is, for example, 20 mm or more, or preferably 50 mm or more, and is, for example, 1000 mm or less, or preferably 200 mm or less.

The embedding portions 33 are formed from the above-described phosphor resin composition. When the phosphor resin composition contains a curable resin, the embedding portions 33 are formed in a B-stage state.

As shown in FIG. 5, the reflector portion 34 is continuous at the circumference end portion of the embedding-reflector sheet 24 and is disposed between the embedding portions 33. The reflector portion 34 is formed into a generally grid shape in plane view surrounding each of the embedding portions 33.

The reflector portion 34 is formed from a reflecting resin composition containing a light reflecting component to be described later.

Next, a method for producing the embedding-reflector sheet 24 is described with reference to FIGS. 5 and 6.

In this method, first, as shown in FIG. 6(a), a pressing device 35 is prepared.

The pressing device 35 is provided with a support board 36 and a die 37 that is disposed in opposed relation to the upper side of the support board 36.

The support board 36 is, for example, formed of a metal such as stainless steel into a generally rectangular flat plate shape.

The die 37 is, for example, formed of a metal such as stainless steel and integrally includes a flat plate portion 38 and extruded portions 39 that are formed to be extruded downwardly from the flat plate portion 38.

The flat plate portion 38 is formed into the same shape as that of the support board 36 in plane view.

In the die 37, a plurality of the extruded portions 39 are disposed at spaced intervals to each other in the plane direction so as to correspond to the embedding portions 33. That is, each of the extruded portions 39 is formed into a generally conical trapezoidal shape in which its width is gradually reduced from the lower surface of the flat plate portion 38 toward the lower side. To be specific, each of the extruded portions 39 is formed into a tapered shape in which its width is gradually reduced toward the lower side in front sectional view and side sectional view. That is, each of the extruded portions 39 is formed into the same shape as that of each of the embedding portions 33.

As shown in FIG. 6(a), a spacer 40 is provided on the upper surface of the circumference end portion of the support board 36. The spacer 40 is, for example, formed of a metal such as stainless steel and is disposed so as to surround a plurality of the embedding portions 33 when projected in the thickness direction. The spacer 40 is disposed on the support board 36 so as to be included in the die 37, to be specific, to be overlapped with the circumference end portion of the flat plate portion 38, when projected in the thickness direction.

The thickness of the spacer 40 is set so as to be the total thickness of the thickness of a releasing sheet 49 to be described later and that of each of the extruded portions 39. To be specific, the thickness of the spacer 40 is, for example, 0.3 mm or more, or preferably 0.5 mm or more, and is, for example, 5 mm or less, or preferably 3 mm or less.

In the pressing device 35, the die 37 is configured to be replaceable with that having a different shape. To be specific, in the pressing device 35, the die 37 having the extruded portions 39 shown in FIG. 6(a) is configured to be replaceable with the die 37 in a flat plate shape having no extruded portion 39 shown in FIG. 6(c) to be described later.

As shown in FIG. 6(a), the releasing sheet 49 is disposed at the inner side of the spacer 40 on the upper surface of the support board 36. The circumference end surfaces of the releasing sheet 49 are, on the upper surface of the support board 36, formed so as to be in contact with the inner side surfaces of the spacer 40. The thickness of the releasing sheet 49 is, for example, 10 μm or more, or preferably 30 μm or more, and is, for example, 200 μm or less, or preferably 150 μm or less.

Next, in the pressing device 35 shown in FIG. 6(a), a reflector sheet 42 is disposed on the upper surface of the releasing sheet 49.

In order to dispose the reflector sheet 42 on the upper surface of the releasing sheet 49, for example, the following method is used: that is, a laminating method in which the reflector sheet 42 formed from a reflecting resin composition is laminated on the upper surface of the releasing sheet 49 or an application method in which a liquid reflecting resin composition is applied to the upper surface of the releasing sheet 49.

The reflecting resin composition contains, for example, a resin and a light reflecting component.

An example of the resin includes a thermosetting resin such as a thermosetting silicone resin, an epoxy resin, a thermosetting polyimide resin, a phenol resin, a urea resin, a melamine resin, an unsaturated polyester resin, a diallyl phthalate resin, and a thermosetting urethane resin. Preferably, a thermosetting silicone resin and an epoxy resin are used.

The light reflecting component is, for example, a white compound. To be specific, an example of the white compound includes a white pigment.

An example of the white pigment includes a white inorganic pigment. Examples of the white inorganic pigment include an oxide such as a titanium oxide, a zinc oxide, and a zirconium oxide; a carbonate such as white lead (lead carbonate) and calcium carbonate; and a clay mineral such as kaolin (kaolinite).

As the white inorganic pigment, preferably, an oxide is used, or more preferably, a titanium oxide is used.

To be specific, the titanium oxide is $TiO_2$ (titanium oxide (IV), titanium dioxide).

A crystal structure of the titanium oxide is not particularly limited. Examples of the crystal structure thereof include a rutile type, a brookite type (pyromelane), and an anatase type (octahedrite). Preferably, a rutile type is used.

A crystal system of the titanium oxide is not particularly limited. Examples of the crystal system thereof include a tetragonal system and an orthorhombic system. Preferably, a tetragonal system is used.

When the crystal structure and the crystal system of the titanium oxide are the rutile type and the tetragonal system, respectively, it is possible to effectively prevent a reduction of the reflectivity with respect to light (to be specific, visible light, among all, the light around the wavelength of 450 nm) even in a case where the reflector portion 34 is exposed to a high temperature for a long time.

The light reflecting component is in the form of a particle. The shape thereof is not limited and examples of the shape thereof include a sphere shape, a plate shape, and a needle shape. The average value of the maximum length (in the case of a sphere shape, the average particle size) of the light reflecting component is, for example, 1 nm or more and 1000 nm or less. The average value of the maximum length is measured using a laser diffraction scattering particle size analyzer.

The mixing ratio of the light reflecting component with respect to 100 parts by mass of the resin is, for example, 0.5 parts by mass or more, or preferably 1.5 parts by mass or more, and is, for example, 90 parts by mass or less, or preferably 70 parts by mass or less.

The above-described light reflecting component is uniformly dispersed and mixed in the resin.

Also, the above-described filler can be further added to the reflecting resin composition. That is, the filler can be used in combination with the light reflecting component (to be specific, a white pigment).

An example of the filler includes a known filler excluding the above-described white pigment. To be specific, examples of the filler include organic microparticles such as silicone particles and inorganic microparticles such as silica, talc, alumina, aluminum nitride, and silicon nitride.

The addition ratio of the filler is adjusted so that the total amount of the filler and the light reflecting component with respect to 100 parts by mass of the resin is, for example, 10 parts by mass or more, preferably 25 parts by mass or more, or more preferably 40 parts by mass or more, and is, for example, 80 parts by mass or less, preferably 75 parts by mass or less, or more preferably 60 parts by mass or less.

In the laminating method, the reflecting resin composition is prepared in an A-stage state by blending the above-described resin and light reflecting component, and the filler, which is added as required, to be uniformly mixed.

Subsequently, in the laminating method, the reflecting resin composition in an A-stage state is applied to the surface of a release sheet that is not shown by an application method such as a casting, a spin coating, or a roll coating and thereafter, the applied product is heated to be brought into a B-stage state or C-stage state. An example of the release sheet includes the same one as the above-described release sheet 6.

Alternatively, for example, the reflecting resin composition in an A-stage state is applied to the surface of a release sheet that is not shown using a screen printing or the like by the above-described application method and thereafter, the applied product is heated to form the reflector sheet 42 in a B-stage state or C-stage state.

Thereafter, the reflector sheet 42 is transferred onto the releasing sheet 49. Subsequently, the release sheet that is not shown is peeled off.

On the other hand, in the application method, the above-described reflecting resin composition in an A-stage state is applied to the upper surface of the releasing sheet 49 using a screen printing or the like and thereafter, the applied product is heated to form the reflector sheet 42 in a B-stage state.

The thickness of the reflector sheet 42 is, for example, 0.3 mm or more, or preferably 0.5 mm or more, and is, for example, 5 mm or less, or preferably 3 mm or less.

Subsequently, as shown by the arrows in FIG. 6(*a*), and in FIG. 6(*b*), the reflector sheet 42 is pressed by the pressing device 35.

To be specific, the die 37 is pushed down with respect to the support board 36. To be more specific, the die 37 is pushed downwardly so that the extruded portions 39 pass through the reflector sheet 42 in the thickness direction. Along with this, the circumference end portion of the flat plate portion 38 in the die 37 is brought into contact with the upper surface of the spacer 40.

In this way, as shown in FIG. 6(*b*), in the reflector sheet 42, through holes 41, which pass through the reflector sheet 42 in the thickness direction and are in shapes corresponding to the extruded portions 39, are formed.

In the pushing down of the die 37, when the reflecting resin composition contains a thermosetting resin in a B-stage state, a heater (not shown) is built in the die 37 in advance and the reflector sheet 42 can be also heated by the heater. In this way, the reflecting resin composition is completely cured (is brought into a C-stage state).

The heating temperature is, for example, 80° C. or more, or preferably 100° C. or more, and is, for example, 200° C. or less, or preferably 180° C. or less.

In this way, the reflector portion 34 is formed on the releasing sheet 49.

Thereafter, as shown in FIG. 6(*c*), a pressing state of the pressing device 35 is released. To be specific, the die 37 is pulled up.

Subsequently, the die 37 including the flat plate portion 38 and the extruded portions 39 is replaced with the die 37 including the flat plate portion 38 only.

Along with this, the phosphor sheet 5 is disposed on the reflector portion 34.

To be specific, the phosphor sheet 5 is disposed on the upper surface of the reflector portion 34 so as to cover the through holes 41.

When the phosphor resin composition contains a curable resin, the phosphor sheet 5 in a B-stage state is disposed on the reflector portion 34. The phosphor sheet 5 in a B-stage state can retain its flat plate shape to some extent, so that it is disposed on the upper surface of the reflector portion 34 so as to cover the through holes 41 without falling into the inside of the through holes 41.

The phosphor sheet 5 is formed to be more flexible than the reflector portion 34 (to be specific, the reflector portion 34 in a C-stage state when the reflecting resin composition of the reflector sheet 42 contains a curable resin). To be specific, the reflector portion 34 is formed to have non-deformable hardness by the next pressing (ref: FIG. 6(d)), while the phosphor sheet 5 is formed to have deformable flexibility by the next pressing.

Next, as shown in FIG. 6(d), the phosphor sheet 5 is pressed by the pressing device 35. To be specific, the die 37 made of the flat plate portion 38 is pushed down toward the support board 36. Along with this, the circumference end portion of the flat plate portion 38 is brought into contact with the upper surface of the spacer 40. The lower surface of the flat plate portion 38 is in contact with the upper surface of the reflector portion 34.

In this way, the relatively flexible phosphor sheet 5 is pressed from the upper side by the flat plate portion 38 to fill the through holes 41. On the other hand, the relatively hard reflector portion 34 is not deformed and houses the embedding portions 33 in the through holes 41 therein.

When the curable resin is a thermosetting resin, the phosphor sheet 5 can be heated by a heater that is built in the flat plate portion 38.

In this way, the embedding portions 33 are formed in the through holes 41 in the reflector portion 34.

In this way, the embedding-reflector sheet 24 including the embedding portions 33 and the reflector portion 34 is obtained between the support board 36 and the die 37.

Thereafter, as shown in FIG. 6(e), the die 37 is pulled up and subsequently, the embedding-reflector sheet 24 is peeled from the releasing sheet 49.

Next, using the embedding-reflector sheet 24 shown in FIG. 6(e), a method for producing the phosphor sheet-covered LED 10 and the LED device 15, which has different steps from those in the above-described embodiment, is described in detail with reference to FIG. 4.

[Sheet Disposing Step]

As shown by the upper side view in FIG. 4(b), the embedding-reflector sheet 24 is disposed above the support sheet 1 so that each of the embedding portions 33 is formed into a tapered shape in which its width is gradually reduced toward the lower side.

That is, each of a plurality of the embedding portions 33 is disposed in opposed relation to each of a plurality of the LEDs 4. To be specific, each of the embedding portions 33 is disposed to be opposed to the center of each of the LEDs 4 and each of the LEDs 4 is also disposed at spaced intervals to the inner side of the reflector portion 34 in plane view.

Subsequently, as shown in FIG. 4(c), the embedding-reflector sheet 24 is pressed. In this way, each of the LEDs 4 is embedded in each of the embedding portions 33 so that the upper surface and the side surfaces of the LED 4 are covered with the embedding portion 33.

[Encapsulating Step]

As shown in FIG. 4(d), in the encapsulating step, when the phosphor resin composition contains a curable resin, the phosphor sheet 5 is cured. In this way, the embedding portions 33 are completely cured. In this way, each of the LEDs 4 is encapsulated by each of the embedding portions 33.

[Cutting Step]

As shown by the dashed lines in FIG. 4(d), in the cutting step, the reflector portion 34 is cut along the thickness direction. As shown by the dash-dot lines in FIG. 5, for example, the phosphor sheet 5 is cut so that the reflector portion 34 is formed into a generally rectangular shape in plane view that surrounds each of the embedding portions 33.

By the cutting step, the phosphor sheet-covered LEDs 10, each of which includes one LED 4, the embedding portion 33 that embeds the LED 4, and the reflector portion 34 that is provided around the embedding portion 33, are obtained in a state of being in close contact with the support sheet 1. That is, each of the phosphor sheet-covered LEDs 10 includes the reflector portion 34. That is, the phosphor sheet-covered LED 10 is a reflector portion-including phosphor sheet-covered LED 10.

[LED Peeling Step]

In the LED peeling step, as shown in FIG. 4(e), each of the phosphor sheet-covered LEDs 10 each including the reflector portion 34 is peeled from the support sheet 1.

[Mounting Step]

In the mounting step, after the phosphor sheet-covered LED 10 including the reflector portion 34 is selected in accordance with emission wavelength and luminous efficiency, as shown in FIG. 4(f), the selected phosphor sheet-covered LED 10 is mounted on the board 9. In this way, the LED device 15 is obtained.

In this way, the LED device 15 including the board 9 and the phosphor sheet-covered LED 10 that is mounted on the board 9 and includes the reflector portion 34 is obtained.

According to the second embodiment, the embedding-reflector sheet 24 includes the embedding portion 33 that embeds the LED 4 and the reflector portion 34 that contains a light reflecting component and is formed so as to surround the embedding portion 33, so that light emitted from the LED 4 can be reflected by the reflector portion 34. Thus, the luminous efficiency of the LED device 15 can be improved.

<Modified Example>

In the second embodiment, the embedding portion 33 is formed from a phosphor resin composition that contains a phosphor. Alternatively, for example, the embedding portion 33 can be also formed from an encapsulating resin composition that does not contain a phosphor.

Also, the release sheet 6 (ref: the phantom lines in FIG. 4(b)) is provided between the flat plate portion 38 and the phosphor sheet 5 that are shown in FIG. 6(c) to form the embedding-reflector sheet 24 in which the release sheet 6 is laminated on the upper surface thereof. Thereafter, as shown by the phantom lines in FIG. 4(c), the embedding-reflector sheet 24 can be also, for example, subjected to flat plate pressing with respect to a plurality of the LEDs 4 and the support sheet 1.

<Third Embodiment>

FIG. 7 shows process drawings for illustrating a method for producing an embedding-reflector sheet used in a third embodiment of a method for producing an encapsulating layer-covered semiconductor element of the present invention.

In the third embodiment, the same reference numerals are provided for members and steps corresponding to each of those in the second embodiment, and their detailed description is omitted.

In the method for producing the embedding-reflector sheet 24 in the second embodiment, as shown in FIGS. 6(c) and 6(d), the embedding portions 33 are formed of the phosphor sheet 5. Alternatively, for example, as shown in FIG. 7(c), the embedding portions 33 can be also formed by potting a varnish of a phosphor resin composition into the through holes 41 without using the phosphor sheet 5.

To be specific, first, the phosphor resin composition is prepared as a varnish. To be specific, when the phosphor resin composition contains a curable resin, a varnish in an A-stage state is prepared. In this way, the phosphor resin composition in an A-stage state fills the through holes 41.

Thereafter, when the phosphor resin composition contains a curable resin, the phosphor resin composition in an A-stage state is brought into a B-stage state.

In the third embodiment, the same function and effect as that of the second embodiment can be achieved.

<Fourth Embodiment>

FIG. 8 shows process drawings for illustrating a fourth embodiment of a method for producing an encapsulating layer-covered semiconductor element of the present invention.

In the fourth embodiment, the same reference numerals are provided for members and steps corresponding to each of those in the second and third embodiments, and their detailed description is omitted.

In the second embodiment, as shown in FIGS. 4(b) and 5, the lower end portion of the embedding portion 33 is formed to be larger than the LED 4 in plane view. Alternatively, for example, as shown in FIG. 8(b), the lower end portion of the embedding portion 33 can be formed to be the same size as that of the LED 4.

[LED Disposing Step]

Each of the embedding portions 33 is, for example, formed into a generally quadrangular pyramid trapezoidal shape in which its width is gradually reduced toward the lower side.

In order to form the embedding portions 33 shown in FIG. 8(b), each of the extruded portions 39 referred in FIGS. 6 and 7 is formed into a generally quadrangular pyramid trapezoidal shape in which its width is gradually reduced from the lower surface of the flat plate portion 38 toward the lower side.

Also, as shown by the dash-dot lines in FIG. 8(b), the embedding-reflector sheet 24 is disposed on the pressure-sensitive adhesive layer 3 including the LEDs 4 so that, when projected in the thickness direction, the lower end portion of each of the embedding portions 33 is overlapped with each of the LEDs 4, to be specific, the circumference end edge of the lower end portion of each of the embedding portions 33 is formed at the same position as the circumference end edge of each of the LEDs 4 in plane view.

In the fourth embodiment, the same function and effect as those of the second and third embodiments can be achieved.

<Fifth Embodiment>

FIG. 9 shows process drawings for illustrating a fifth embodiment of a method for producing an encapsulating layer-covered semiconductor element of the present invention. FIG. 10 shows process drawings for illustrating a method for producing the embedding-reflector sheet shown in FIG. 9(b).

In the fifth embodiment, the same reference numerals are provided for members and steps corresponding to each of those in the second embodiment, and their detailed description is omitted.

In the second embodiment, as shown in FIG. 4(b), each of the embedding portions 33 in the embedding-reflector sheet 24 is formed into a generally conical trapezoidal shape in which its width is gradually reduced toward the lower side. Alternatively, for example, as shown in FIG. 9(b), each of the embedding portions 33 can be also formed into a generally column shape extending in the up-down direction (the thickness direction).

In order to form the embedding portions 33, a punching device 55 shown in FIGS. 10(a) and 10(b) is used.

The punching device 55 is provided with a support board 56 and a die 57 that is disposed in opposed relation to the upper side of the support board 56.

The support board 56 is, for example, formed of a metal such as stainless steel into a generally rectangular flat plate shape. Through holes 53 that pass through the support board 56 in the thickness direction are formed.

Each of the through holes 53 is formed into a generally circular shape in plane view.

The die 57 integrally includes a flat plate portion 58 and extruded portions 59 that are formed to be extruded downwardly from the flat plate portion 58.

The flat plate portion 58 is formed into the same shape as that of the flat plate portion 38 shown in FIG. 6(a).

In the die 57, a plurality of the extruded portions 59 are disposed at spaced intervals to each other in the plane direction so as to correspond to the embedding portions 33 (ref: FIG. 10(d)). That is, each of the extruded portions 59 is formed into the same shape and the same size as those of each of the through holes 53 in plane view, to be specific, into a generally column shape. Each of the extruded portions 59 is formed into the same shape as that of each of the embedding portions 33 (ref: FIG. 10(d)). That is, each of the extruded portions 59 is formed into a generally rectangular shape in front sectional view and side sectional view.

In this way, the punching device 55 is configured to allow the extruded portions 59 to be capable of being inserted into the through holes 53 by the pushing down of the die 57.

The hole diameter of each of the through holes 53 and the diameter of each of the extruded portions 59 are, for example, 5 mm or more, or preferably 7 mm or more, and are, for example, 300 mm or less, or preferably 200 mm or less.

The spacer 40 is provided on the upper surface of the circumference end portion of the support board 56. The spacer 40 is, in plane view, disposed in a generally frame shape in plane view at the circumference end portion of the support board 56 so as to surround the through holes 53.

In order to form the embedding-reflector sheet 24 by the punching device 55 shown in FIGS. 10(a) and 10(b), first, as shown in FIG. 10(a), the reflector sheet 42 is disposed on the support board 56. To be specific, the reflector sheet 42 is disposed on the upper surface of the support board 56 so as to cover a plurality of the through holes 53.

Next, as shown in FIG. 10(b), the reflector sheet 42 is stamped out using the punching device 55.

To be specific, the extruded portions 59 stamp out the reflector sheet 42 by pushing down the die 57.

In this way, the through holes 41 in shapes corresponding to the extruded portions 59 are formed in the reflector sheet 42.

In this way, the reflector portion 34 is formed on the support board 56.

Next, as shown in FIG. 10(c), the die 57 is pulled up.

Thereafter, the formed reflector portion 34 is disposed in the pressing device 35 that is provided with the support board 36 and the die 37 made of the flat plate portion 38, and includes the releasing sheet 49.

Next, the phosphor sheet 5 is disposed on the reflector portion 34.

Next, as shown by the arrows in FIG. 10(c), and in FIG. 10(d), the phosphor sheet 5 is pressed by the pressing device 35. In this way, the embedding portions 33 are formed in the inside of the through holes 41 in the reflector portion 34.

In this way, the embedding-reflector sheet 24 including the embedding portions 33 and the reflector portion 34 is obtained between the support board 36 and the die 37.

Thereafter, the die 37 is pulled up and subsequently, as shown in FIG. 10(e), the embedding-reflector sheet 24 is peeled from the releasing sheet 49.

In the fifth embodiment, the same function and effect as that of the second embodiment can be achieved.

<Sixth Embodiment>

FIG. 11 shows process drawings for illustrating a method for producing an embedding-reflector sheet used in a sixth embodiment of a method for producing an encapsulating layer-covered semiconductor element of the present invention.

In the sixth embodiment, the same reference numerals are provided for members and steps corresponding to each of those in the fifth embodiment, and their detailed description is omitted.

In the method for producing the embedding-reflector sheet 24 in the fifth embodiment, as shown in FIGS. 10(c) and 10(d), the embedding portions 33 are formed of the phosphor sheet 5. Alternatively, for example, as shown in FIG. 11(c), the embedding portions 33 can be also formed by potting a varnish of a phosphor resin composition into the through holes 41 without using the phosphor sheet 5.

To be specific, the reflector portion 34 shown in FIG. 11(b) is taken out from the punching device 55 to be subsequently, as shown in FIG. 11(c), disposed on the upper surface of the releasing sheet 49. Then, the varnish of the phosphor resin composition is potted into the through holes 41.

In the sixth embodiment, the same function and effect as that of the fifth embodiment can be achieved.

<Seventh Embodiment>

FIG. 12 shows process drawings for illustrating a seventh embodiment of a method for producing an encapsulating layer-covered semiconductor element of the present invention.

In the seventh embodiment, the same reference numerals are provided for members and steps corresponding to each of those in the fifth embodiment, and their detailed description is omitted.

In the fifth embodiment, as shown in FIG. 9(c), the embedding portions 33 that embed the LEDs 4 are illustrated as cover portions. Alternatively, for example, as shown in FIG. 12(c), cover portions 43 that cover the upper surfaces of the LEDs 4 can be also illustrated.

As shown in FIG. 12(b), the cover portions 43 are provided in a cover-reflector sheet 44 so as to be surrounded by the reflector portion 34. In the cover-reflector sheet 44, each of the cover portions 43 is formed into the same shape as that of each of the embedding portions 33 shown in FIG. 9(b) and furthermore, as shown by the dash-dot lines in FIG. 12(b), is formed into the same size as that of each of the LEDs 4.

As shown in FIG. 12(b), for example, each of the cover portions 43 is disposed on the upper surface of each of the LEDs 4 so that each of the cover portions 43 is overlapped with each of the LEDs 4 when projected in the thickness direction, to be specific, the circumference end edge of each of the cover portions 43 is formed at the same position as the circumference end edge of each of the LEDs 4 in plane view.

[Upper Surface-Covering Step]

In the seventh embodiment, the upper surface-covering step shown in FIG. 12(c) is performed instead of the embedding step in the sheet disposing step shown in FIG. 9(c). The conditions of the upper surface-covering step are the same as those of the embedding step.

In the upper surface-covering step shown in FIG. 12(c), each of the cover portions 43 covers the upper surface of each of the LEDs 4. The LED 4 is pressed into the cover portion 43 by pressing of the LED 4, so that the cover portion 43 slightly expands outwardly in the plane direction. The degree of expansion thereof is subtle, so that in FIG. 12(c), the lengths in the right-left direction of the cover portion 43 and the LED 4 after the pressing are shown to be the same.

[Curing Step]

In the seventh embodiment, the curing step shown in FIG. 12(d) is performed instead of the encapsulating step shown in FIG. 9(d).

In the curing step, the cover portions 43 are cured. The conditions of the curing step are the same as those of the above-described encapsulating step.

In the seventh embodiment, the same function and effect as that of the fifth embodiment can be achieved.

<Eighth Embodiment>

FIG. 13 shows process drawings for illustrating an eighth embodiment of a method for producing an encapsulating layer-covered semiconductor element of the present invention.

In the eighth embodiment, the same reference numerals are provided for members and steps corresponding to each of those in the first embodiment, and their detailed description is omitted.

In the first embodiment, as shown in FIG. 1(c), in the sheet disposing step, the embedding step in which the side surfaces and the upper surfaces of the LEDs 4 are covered with the phosphor sheet 5 is performed. Alternatively, for example, as shown in FIG. 13(c), the side surface-covering step in which the side surfaces only of the LEDs 4 are covered with the phosphor sheet 5 can be performed instead of the embedding step. Also, the curing step can be performed instead of the encapsulating step.

[Sheet Disposing Step]

As shown in FIG. 13(b), the thickness of the prepared phosphor sheet 5 is set to be thinner than that of each of the LEDs 4, that is, set to be, for example, 95% or less, or preferably 90% or less, and to be, for example, 10% or more with respect to the thickness of each of the LEDs 4. To be specific, the thickness of the phosphor sheet 5 is set to be, for example, 1000 µm or less, or preferably 800 µm or less, and to be, for example, 30 µm or more, or preferably 50 µm or more.

[Side Surface-Covering Step]

As shown in FIG. 13(c), a laminate (ref: the upper side view in FIG. 13(b)) made of the release sheet 6 and the phosphor sheet 5 laminated on the lower surface of the release sheet 6 is pressed into the support sheet 1 including the LEDs 4 so that the lower surface of the release sheet 6 is in contact with the upper surfaces of the LEDs 4 by the pressing.

The upper surface of the phosphor sheet 5, which is pressed into gaps between a plurality of the LEDs 4, is formed to be flush with the upper surfaces of the LEDs 4. The lower surface of the phosphor sheet 5 is also formed to be flush with the lower surfaces of the LEDs 4. That is, the thickness of the phosphor sheet 5, which is pressed into gaps between a plurality of the LEDs 4, is the same as that of each of the LEDs 4.

The side surfaces of the LED 4 are covered with the phosphor sheet 5, while both a bump that forms a portion of the lower surface of the LED 4 and the upper surface of the LED 4 are exposed from the phosphor sheet 5.

[Curing Step]

In the curing step, the phosphor sheet 5 is cured. The conditions of the curing step are the same as those of the above-described encapsulating step.

[Cutting Step]

As shown by the dashed lines in FIG. 13(d), the phosphor sheet 5 is cut, while the position of the LEDs 4 is checked from the upper side. To be specific, in the phosphor sheet 5, the position of the LEDs 4 is checked, while the LEDs 4 are visually confirmed from the upper side with, for example, a camera. As referred in the dashed lines in FIG. 5, the phosphor sheet 5 is cut so that the cuts 8 that define a region surrounding each of the LEDs 4 are formed in plane view.

The phosphor sheet 5 can be also cut, while the LEDs 4 are visually confirmed, in addition, with the reference marks 18 (ref: FIG. 2) as a reference.

[LED Peeling Step]

In FIG. 13(e), in the LED peeling step, each of the phosphor sheet-covered LEDs 10 is peeled from the upper surface of the pressure-sensitive adhesive layer 3.

In the eighth embodiment, the same function and effect as that of the first embodiment can be achieved.

In addition, in the side surface-covering step, the side surfaces of the LEDs 4 are covered with the phosphor sheet 5 so that at least the upper surfaces of the LEDs 4 are exposed from the phosphor sheet 5. Thus, in the cutting step after the sheet disposing step, the LEDs 4 having the upper surfaces exposed are visually confirmed and the phosphor sheet 5 can be accurately cut corresponding to the LEDs 4. Therefore, the phosphor sheet-covered LED 10 to be obtained has excellent size stability. As a result, the LED device 15 including the phosphor sheet-covered LED 10 has excellent luminous stability.

<Ninth Embodiment>

Figure 14:
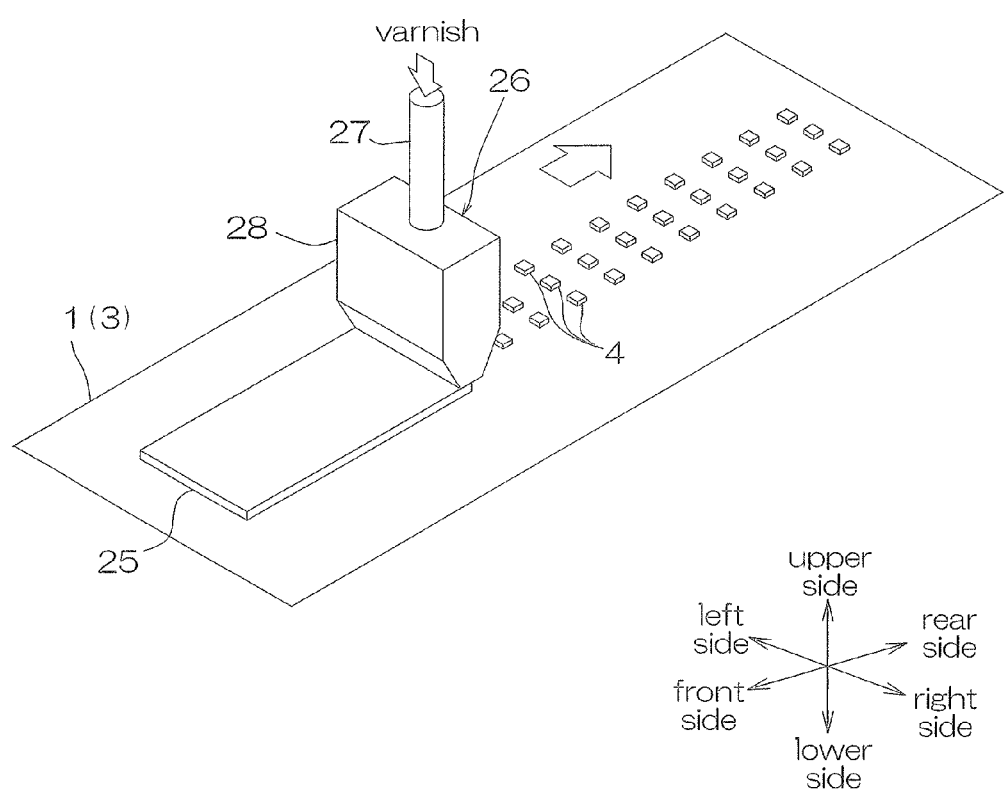
FIG. 14 shows a perspective view of a dispenser used in a ninth embodiment of a method for producing an encapsulating layer-covered semiconductor element of the present invention.

FIG. 14 shows a perspective view of a dispenser used in a ninth embodiment of a method for producing an encapsulating layer-covered semiconductor element of the present invention.

In the ninth embodiment, the same reference numerals are provided for members and steps corresponding to each of those in the first embodiment, and their detailed description is omitted.

In the first embodiment, as shown in FIG. 1(b), in the sheet disposing step that is one example of the layer disposing step of the present invention, the phosphor sheet 5 that is formed in advance is illustrated as a phosphor layer that is one example of the encapsulating layer of the present invention. Alternatively, as referred in FIG. 14, for example, a phosphor resin composition is prepared as a varnish and the varnish is directly applied onto the support sheet 1 so as to cover a plurality of the LEDs 4, so that a phosphor layer 25 as an encapsulating layer can be also formed. That is, the phosphor layer 25 can be formed from the varnish of the phosphor resin composition.

In order to form the phosphor layer 25, first, the varnish is applied onto the support sheet 1 so as to cover the LEDs 4.

In order to apply the varnish, for example, an application device such as a dispenser, an applicator, or a slit die coater is used. Preferably, a dispenser 26 shown in FIG. 14 is used.

As shown in FIG. 14, the dispenser 26 integrally includes an introduction portion 27 and an application portion 28.

The introduction portion 27 is formed into a generally cylindrical shape extending in the up-down direction and the lower end portion thereof is connected to the application portion 28.

The application portion 28 is formed into a flat plate shape extending in the right-left and the up-down directions. The application portion 28 is formed into a generally rectangular shape in side view that is long in the up-down direction. The introduction portion 27 is connected to the upper end portion of the application portion 28. The lower end portion of the application portion 28 is formed into a tapered shape in sectional side view in which the front end portion and the rear end portion are cut off. The lower end surface of the application portion 28 is configured to be capable of being pressed with respect to the upper surface of the pressure-sensitive adhesive layer 3 and the upper surfaces of the LEDs 4. Furthermore, at the inside of the application portion 28, a broad flow path (not shown) in which a varnish introduced from the introduction portion 27 gradually expands in the right-left direction as it goes toward the lower section (downwardly) is provided.

The dispenser 26 is configured to be movable relatively in the front-rear direction with respect to the support sheet 1 extending in the plane direction.

In order to apply the varnish to the support sheet 1 using the dispenser 26, the application portion 28 is disposed in opposed relation (pressed) to the upper surfaces of a plurality of the LEDs 4 and the varnish is supplied to the introduction portion 27. Along with this, the dispenser 26 is moved relatively toward the rear side with respect to a plurality of the LEDs 4. In this way, the varnish is introduced from the introduction portion 27 into the application portion 28 and subsequently, is broadly supplied from the lower end portion of the application portion 28 to the support sheet 1 and the LEDs 4. By the relative movement of the dispenser 26 toward the rear side with respect to a plurality of the LEDs 4, the varnish is applied onto the upper surface of the support sheet 1 in a belt shape extending in the front-rear direction so as to cover a plurality of the LEDs 4.

When the phosphor resin composition contains a curable resin, the varnish is prepared in an A-stage state. When the varnish is, for example, supplied from the application portion 28 to the support sheet 1, it does not flow out of its position outwardly in the plane direction. That is, the varnish has viscous properties of keeping its position. To be specific, the viscosity of the varnish under conditions of 25° C. and 1 pressure is, for example, 1,000 mPa·s or more, or preferably 4,000 mPa·s or more, and is, for example, 1,000,000 mPa·s or less, or preferably 100,000 mPa·s or less. The viscosity is measured by adjusting a temperature of the varnish to 25° C. and using an E-type cone at a number of revolutions of 99 s$^{-1}$.

When the viscosity of the varnish is not less than the above-described lower limit, the varnish can be effectively prevented from flowing outwardly in the plane direction. Thus, it is not required to separately provide a dam member or the like in the support sheet 1 (to be specific, around a plurality of the LEDs 4), so that a simplified process can be achieved. Then, the varnish can be easily and surely applied to the support sheet 1 with a desired thickness and a desired shape with the dispenser 26.

On the other hand, when the viscosity of the varnish is not more than the above-described upper limit, the application properties (the handling ability) can be improved.

Thereafter, when the phosphor resin composition contains a curable resin, the applied varnish is brought into a B-stage state (a semi-cured state).

In this way, the phosphor layer 25 in a B-stage state is formed on the support sheet 1 (on the upper surface of the pressure-sensitive adhesive layer 3) so as to cover a plurality of the LEDs 4.

In the ninth embodiment, the same function and effect as that of the first embodiment can be achieved.

<Modified Example>

In the first to ninth embodiments, a plurality of the LEDs 4 are covered with the phosphor sheet 5. Alternatively, for example, a single piece of the LED 4 can be covered with the phosphor sheet 5.

In such a case, to be specific, in the cutting step shown in FIG. 1(d) that is illustrated in the first embodiment, the phosphor sheet 5 around the LED 4 is trimmed (subjected to trimming) so as to have a desired size.

In the first to eighth embodiments, the LED 4, the phosphor sheet 5, the phosphor sheet-covered LED 10, and the LED device 15 are described as one example of the semiconductor element, the encapsulating layer, the encapsulating layer-covered semiconductor element, and the semiconductor device of the present invention, respectively. Alternatively, for example, though not shown, the semiconductor element, the encapsulating layer, the encapsulating layer-covered semiconductor element, and the semiconductor device of the present invention can also include an electronic element, an encapsulating sheet, an encapsulating layer-covered electronic element, and an electronic device, respectively.

The electronic element is a semiconductor element that converts electrical energy to energy other than light, to be specific, to signal energy or the like. Examples thereof include a transistor and a diode. The size of the electronic element is appropriately selected in accordance with its use and purpose.

The encapsulating sheet is formed from an encapsulating resin composition that contains a curable resin as an essential component and a filler as an optional component. An example of the filler further includes a black pigment such as carbon black. The mixing ratio of the filler with respect to 100 parts by mass of the curable resin is, for example, 5 parts by mass or more, or preferably 10 parts by mass or more, and is, for example, 99 parts by mass or less, or preferably 95 parts by mass or less.

The encapsulating sheet is, as illustrated in FIG. 1(*d*) in the first embodiment or the like, cut so as to correspond to each of the electronic elements as a protective layer covering the electronic elements (to be specific, at least the side surfaces of the electronic elements).

The properties other than light transmission properties (to be specific, compressive elastic modulus and the like) of the encapsulating sheet are the same as those of the phosphor sheet 5 in the first to eighth embodiments.

While the illustrative embodiments of the present invention are provided in the above description, such is for illustrative purpose only and it is not to be construed as limiting the scope of the present invention. Modification and variation of the present invention that will be obvious to those skilled in the art is to be covered by the following claims.

What is claimed is:

1. A method for producing an encapsulating layer-covered semiconductor element comprising:
   a preparing step of preparing a support sheet including a hard support board formed with a through hole passing through an upper surface of the hard support board to a lower surface, and a pressure-sensitive adhesive layer laminated on the upper surface of the hard support board so as to cover the through hole;
   a semiconductor element disposing step of disposing a semiconductor element on an upper surface of the pressure-sensitive adhesive layer opposite the through hole;
   a semiconductor element covering step of covering the semiconductor element with an encapsulating layer to produce an encapsulating layer-covered semiconductor element including the semiconductor element and the encapsulating layer covering the semiconductor element; and
   a semiconductor element peeling step of inserting a pressing member into the through hole from the lower surface of the hard support board to press the pressure-sensitive adhesive layer corresponding to the through hole to relatively move the encapsulating layer-covered semiconductor element upward and peel the encapsulating layer-covered semiconductor element from the pressure-sensitive adhesive layer.

2. The method for producing an encapsulating layer-covered semiconductor element according to claim 1, wherein the encapsulating layer is formed of an encapsulating sheet.

3. The method for producing an encapsulating layer-covered semiconductor element according to claim 1, wherein
   the semiconductor element covering step includes
   a layer disposing step of, after the semiconductor element disposing step, disposing the encapsulating layer formed from an encapsulating resin composition containing a curable resin on an upper surface of the support sheet to embed the semiconductor element;
   an encapsulating step of curing the encapsulating layer to encapsulate the semiconductor element by the encapsulating layer that is flexible; and
   a cutting step of, after the encapsulating step, cutting the encapsulating layer that is flexible corresponding to the semiconductor element to produce the encapsulating layer-covered semiconductor element including the semiconductor element and the encapsulating layer covering the semiconductor element.

4. The method for producing an encapsulating layer-covered semiconductor element according to claim 3, wherein
   in the layer disposing step, the semiconductor element is embedded by the encapsulating layer that is in a B-stage state and
   in the encapsulating step, the encapsulating layer is cured to be brought into a C-stage state and the semiconductor element is encapsulated by the encapsulating layer in a C-stage state.

5. The method for producing an encapsulating layer-covered semiconductor element according to claim 1, wherein
   in the preparing step, the support sheet is prepared so that a reference mark, which serves as a reference of cutting in the cutting step, is provided in advance.

6. The method for producing an encapsulating layer-covered semiconductor element according to claim 1, wherein
   the semiconductor element is an LED and
   the encapsulating layer is a phosphor layer.

7. The method for producing an encapsulating layer-covered semiconductor element according to claim 1, wherein
   the encapsulating layer includes
   a cover portion that covers the semiconductor element and
   a reflector portion that contains a light reflecting component and is formed so as to surround the cover portion.

* * * * *